(12) United States Patent
Bernard et al.

(10) Patent No.: US 12,528,143 B2
(45) Date of Patent: Jan. 20, 2026

(54) METHODS OF SPLITTING A SEMICONDUCTOR WORK PIECE

(71) Applicant: Infineon Technologies AG, Neubiberg (DE)

(72) Inventors: Benjamin Bernard, Villach (AT); Alexander Binter, Villach (AT); Heimo Graf, Trebesing (AT)

(73) Assignee: Infineon Technologies AG, Neubiberg (DE)

( * ) Notice: Subject to any disclaimer, the term of this patent is extended or adjusted under 35 U.S.C. 154(b) by 701 days.

(21) Appl. No.: 17/691,763

(22) Filed: Mar. 10, 2022

(65) Prior Publication Data

US 2022/0339740 A1     Oct. 27, 2022

(30) Foreign Application Priority Data

Apr. 27, 2021     (DE) .......................... 102021110742.3

(51) Int. Cl.
*B23K 26/53*     (2014.01)
*B23K 26/06*     (2014.01)
(Continued)

(52) U.S. Cl.
CPC .......... *B23K 26/53* (2015.10); *B23K 26/0608* (2013.01); *B23K 26/0622* (2015.10);
(Continued)

(58) Field of Classification Search
CPC ................ B23K 26/53; B23K 26/0622; B23K 26/0608; B23K 26/0665; B23K 26/0676;
(Continued)

(56) References Cited

U.S. PATENT DOCUMENTS 7,442,599 B2     10/2008     Maa et al.
7,696,065 B2     4/2010     Sato et al.
(Continued)

FOREIGN PATENT DOCUMENTS

CN     101195190 A     6/2008
CN     101256948 A     9/2008
(Continued)

OTHER PUBLICATIONS

Lapointe, Jerome, et al., "A simple technique to overcome self-focusing, filamentation, supercontinuum generation, aberrations, depth dependence and waveguide interface roughness using fs laser processing", Scientific Reports, 7: 499, DOI:10.1038/s41598-017-00589-8, Mar. 29, 2017, 1-13.
(Continued)

*Primary Examiner* — Alonzo Chambliss
(74) *Attorney, Agent, or Firm* — Murphy, Bilak & Homiller, PLLC

(57)     ABSTRACT

A method of splitting a semiconductor work piece includes: forming a separation zone within the semiconductor work piece, wherein forming the separation zone comprises modifying semiconductor material of the semiconductor work piece at a plurality of targeted positions within the separation zone in at least one physical property which increases thermo-mechanical stress within the separation zone relative to a remainder of the semiconductor work piece, wherein modifying the semiconductor material in one of the targeted positions comprises focusing at least two laser beams to the targeted position; and applying an external force or stress to the semiconductor work piece such that at least one crack propagates along the separation zone and the semiconductor work piece splits into two separate pieces. Additional work piece splitting techniques and techniques for compensating
(Continued)

work piece deformation that occurs during the splitting process are also described.

19 Claims, 20 Drawing Sheets

(51) Int. Cl.
    *B23K 26/0622*     (2014.01)
    *B23K 26/067*     (2006.01)
    *B23K 26/073*     (2006.01)
    *B28D 5/00*     (2006.01)
    *H01L 21/268*     (2006.01)
    *H01L 21/78*     (2006.01)
    *B23K 103/00*     (2006.01)
    *H01L 21/04*     (2006.01)

(52) U.S. Cl.
    CPC ...... *B23K 26/0665* (2013.01); *B23K 26/0676* (2013.01); *B23K 26/0734* (2013.01); *B28D 5/0011* (2013.01); *H01L 21/268* (2013.01); *H01L 21/78* (2013.01); *B23K 2103/56* (2018.08); *H01L 21/0475* (2013.01)

(58) Field of Classification Search
    CPC ............ B23K 26/0734; B23K 26/0624; B28D 5/0011; H01L 21/268; H01L 21/78
    See application file for complete search history.

(56) References Cited

U.S. PATENT DOCUMENTS

| | | | |
|---|---|---|---|
| 7,867,873 B2 | 1/2011 | Murakami et al. | |
| 8,685,838 B2* | 4/2014 | Fukuyo | B23K 26/60 |
| | | | 438/460 |
| 9,312,165 B2 | 4/2016 | Hachigo et al. | |
| 9,620,415 B2 | 4/2017 | Hirata et al. | |
| 9,761,493 B2 | 9/2017 | Celler | |
| 9,779,968 B2 | 10/2017 | Iguchi | |
| 10,357,851 B2 | 7/2019 | Nishino et al. | |
| 10,388,526 B1 | 8/2019 | Seddon et al. | |
| 10,611,052 B1* | 4/2020 | Bubel | H10D 62/8325 |
| 10,770,648 B2 | 9/2020 | Akiyama et al. | |
| 10,828,800 B2 | 11/2020 | Bertoni et al. | |
| 10,852,240 B2 | 12/2020 | Murazawa et al. | |
| 11,081,393 B2* | 8/2021 | Beyer | H01L 21/02118 |
| 11,373,863 B2* | 6/2022 | Rupp | B23K 26/402 |
| 12,151,314 B2* | 11/2024 | Swoboda | H01L 21/7806 |
| 2001/0028385 A1 | 10/2001 | Hayashi | |
| 2005/0274702 A1 | 12/2005 | Deshi | |
| 2006/0049487 A1 | 3/2006 | Sato et al. | |
| 2006/0148210 A1 | 7/2006 | Furuta et al. | |
| 2006/0208167 A1 | 9/2006 | Morikazu | |
| 2007/0298529 A1 | 12/2007 | Maeda et al. | |
| 2010/0009549 A1 | 1/2010 | Sekiya | |
| 2010/0015788 A1 | 1/2010 | Sasaki et al. | |
| 2014/0038392 A1 | 2/2014 | Yonehara et al. | |
| 2014/0170792 A1 | 6/2014 | Oraw | |
| 2015/0372188 A1* | 12/2015 | Minakuchi | H10H 20/01 |
| | | | 438/33 |
| 2016/0074960 A1 | 3/2016 | Hirata et al. | |
| 2016/0158880 A1 | 6/2016 | Koitzsch et al. | |
| 2016/0336233 A1 | 11/2016 | Yonehara et al. | |
| 2017/0278931 A1 | 9/2017 | Iguchi et al. | |
| 2017/0372965 A1 | 12/2017 | Nishibayashi et al. | |
| 2019/0362972 A1 | 11/2019 | Schulze et al. | |
| 2020/0064269 A1 | 2/2020 | Murazawa et al. | |
| 2020/0066542 A1 | 2/2020 | Drescher et al. | |
| 2020/0316724 A1 | 10/2020 | Donofrio et al. | |
| 2020/0381303 A1 | 12/2020 | Hoshino et al. | |
| 2021/0053148 A1 | 2/2021 | Rieske et al. | |
| 2021/0175123 A1* | 6/2021 | Beyer | H10D 62/8325 |

FOREIGN PATENT DOCUMENTS

| | | |
|---|---|---|
| CN | 106029589 A | 10/2016 |
| CN | 106449507 A | 2/2017 |
| CN | 109071362 A | 12/2018 |
| CN | 109427563 A | 3/2019 |
| JP | 2014104484 A | 6/2014 |
| JP | 2017098453 A | 6/2017 |
| KR | 20160099673 A | 8/2016 |
| KR | 20170136995 A | 12/2017 |
| KR | 20180014701 A | 2/2018 |
| WO | 2016114382 A1 | 7/2016 |
| WO | 2018108938 A1 | 6/2018 |

OTHER PUBLICATIONS

Menard, Kevin P., et al., "Dynamic Mechanical Analysis", Encyclopedia of Analytical Chemistry, 2017, John Wiley & Sons, Ltd.
Swoboda, Marko, et al., "Laser Assisted SiC Wafering Using Cold Split", Materials Science Forum, vol. 897, 2016 European Conference on Silicon Carbide & Related Materials (ECSCRM), Sep. 25-29, 2016, Sep. 1, 2016, pp. 403-406.
"Dynamisch-Mechanische Analyse (DMA)", Elastizitätsmodul, Wiki Polymer Service, accessed online Dec. 2, 2019 at http://wiki.polymerservice-merseburg.de/index.php/Elastizitätsmodul#Dynamisch-Mechanische_Analyse_.28DMA.29.
Jaunich, Matthias, "Tieftemperaturverhalten von Elastomeren im Dichtungseinsatz", [Low-Temperature Characteristics of Elastomers in a Gasket Insert], Thesis, Berlin, Technical University of Berlin, BAM Thesis Series, vol. 79, 2012, accessed online Dec. 2, 2019 at https://d-nb.info/1121035647/34.

* cited by examiner

METHODS OF SPLITTING A SEMICONDUCTOR WORK PIECE

BACKGROUND

Semiconductor work pieces such as semiconductor wafers generally are produced by slicing thin wafer pieces from boules (often called ingots) made of crystalline semiconductor material. Several slicing techniques are known in the art. However, wafer costs including the slicing step make up a significant ratio of the overall production costs of semiconductor devices. Reducing these costs yield a competitive advantage. One way to reduce wafer costs is to reduce kerf-loss during the production of the semiconductor work pieces or semiconductor wafers. Another way is to use a standard wafer at least twice—after producing device structures, the wafer is split and a thinner reclaimed wafer part that does not include the device structures is re-used to form additional device structures. Integrating semiconductor work piece splitting into a standard semiconductor wafer manufacturing production process is involved and complex and requires changes/modification to the production process to yield efficient production.

Thus, there is a demand to provide an improved concept for a splitting process of semiconductor work pieces, which enables a splitting of a semiconductor work piece in an efficient and cost sensitive manner. Furthermore, there is a need of providing an adjusted apparatus or tools for these concepts for an efficient and cost sensitive splitting process.

SUMMARY

According to an embodiment of a method of processing a monocrystalline semiconductor work piece, the method comprises: applying pulses of laser light to a first main surface of the monocrystalline semiconductor work piece, the pulses of laser light penetrating the first main surface and forming modified regions in a separation zone within the monocrystalline semiconductor work piece, each modified region being delimited by a subcritical crack that surrounds an inner part in which the monocrystallinity of the semiconductor work piece is altered; controlling the pulses of laser light such that the subcritical cracks of adjacent ones of the modified regions are non-overlapping for at least half of the modified regions formed in the monocrystalline semiconductor work piece; and after inducing the subcritical cracks, forming at least one crack that connects the subcritical cracks.

According to an embodiment of a method of splitting a semiconductor work piece, the method comprises: forming a separation zone within the semiconductor work piece, wherein forming the separation zone comprises modifying semiconductor material of the semiconductor work piece at a plurality of targeted positions within the separation zone in at least one physical property which increases thermo-mechanical stress within the separation zone relative to a remainder of the semiconductor work piece, wherein modifying the semiconductor material in one of the targeted positions comprises focusing at least two laser beams to the targeted position; and applying an external force or stress to the semiconductor work piece such that at least one crack propagates along the separation zone and the semiconductor work piece splits into two separate pieces.

According to an embodiment of a semiconductor work piece, the semiconductor work piece comprises: a separation zone having a plurality of targeted positions with at least one modified physical property of a semiconductor material of the semiconductor work piece defining a modification zone bidirectionally extending substantially parallel to a surface of the semiconductor work piece, wherein the modification zone has a thickness in an axis perpendicular to the bidirectional extension of the modification zone of less than 30 µm.

According to an embodiment of a semiconductor wafer, the semiconductor wafer comprises: one or more epitaxial layers at a front side of the semiconductor wafer, the one or more epitaxial layers having a plurality of device structures; and a metallization layer and/or a passivation layer over the plurality of device structures, wherein a surface of the one or more epitaxial layers on the semiconductor wafer is substantially free of stray light defects.

According to an embodiment of an apparatus for defining a separation zone within a semiconductor work piece, the apparatus comprises: at least one means for focusing at least two laser beams to a targeted position within the separation zone; and means for moving the at least two laser beams such that a semiconductor material of the semiconductor work piece can be modified at a plurality of targeted positions within the separation zone in at least one physical property.

According to an embodiment of a method of splitting a semiconductor work piece, the method comprises: applying pulses of laser light to a first main surface of the semiconductor work piece, the pulses of laser light penetrating the first main surface and forming modified regions in a separation zone within the semiconductor work piece, each modified region being delimited by a subcritical crack that surrounds an inner part in which a monocrystallinity of the semiconductor work piece is altered; compensating for deformation of the semiconductor work piece that arises during application of the pulses of laser light, such that focus deviation from a target plane within the separation zone is reduced for the pulses of laser light that penetrate the first main surface; and applying an external force or stress to the semiconductor work piece such that at least one crack propagates along the separation zone and the semiconductor work piece splits into two separate pieces.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
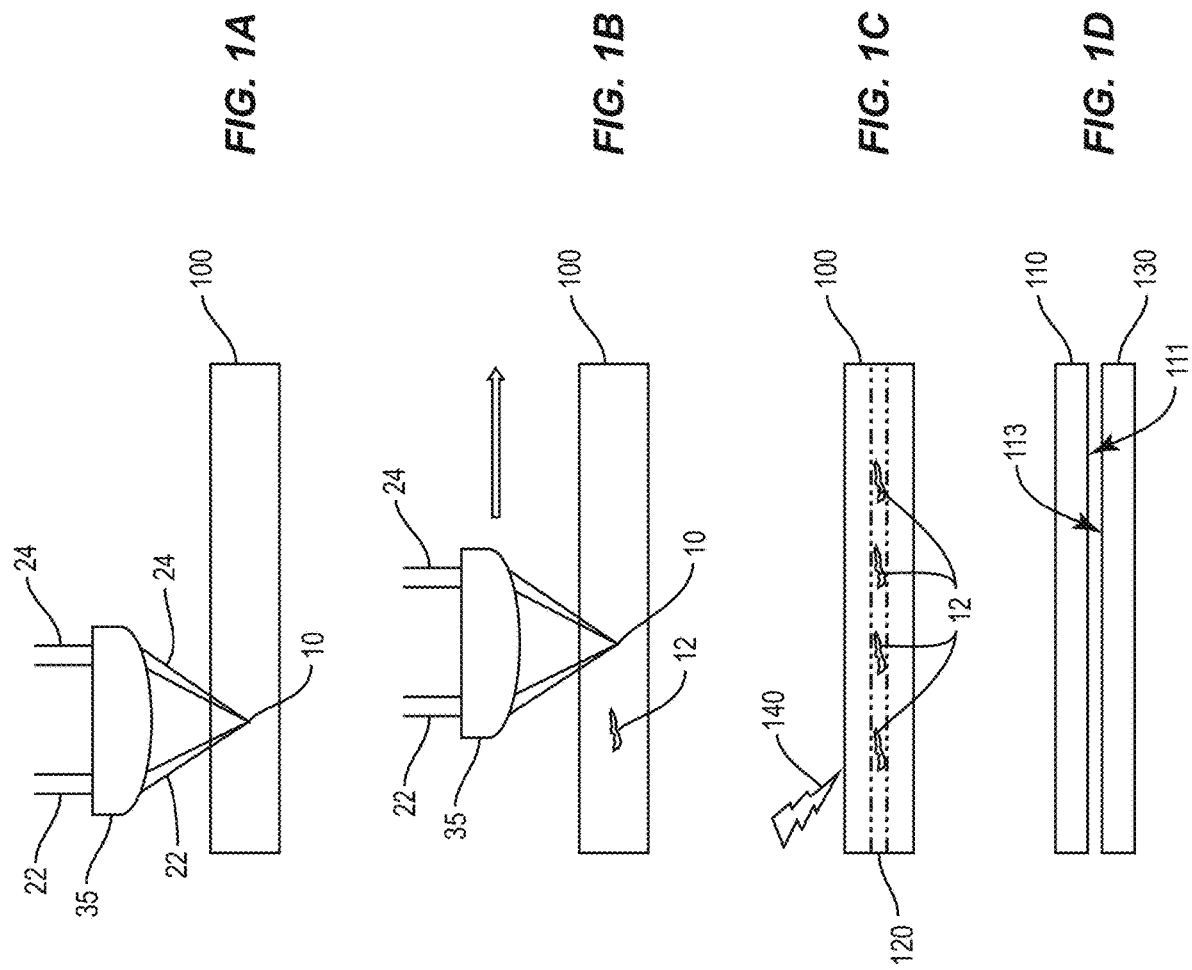
FIGS. 1A through 1D illustrate an embodiment of a method of splitting a semiconductor work piece.

Described herein are methods of splitting semiconductor work pieces. Semiconductor work pieces generally are semiconductor boules (also called ingots) or semiconductor wafers to be processed or already processed wafers or base wafers which are subsequently to be split into a thinner wafer and a reclaimed wafer. While emphasis is placed on SiC wafers and SiC boules as semiconductor work pieces to be processed, the embodiments and examples described herein are not intended to be limited to SiC semiconductor work pieces. Instead of SiC-based semiconductor work pieces, embodiments based on other semiconductor materials such as silicon (Si), gallium arsenide (GaAs), gallium nitride (GaN), gallium oxide (Ga2O3), indium gallium nitride (InGaN), sapphire (Al2O3), etc. can be used in the methods. Besides at least one semiconductor material, the semiconductor work pieces may comprise further materials (e.g., polycrystalline portions and/or metal portions) and/or components (e.g., doping atoms and/or impurities caused by manufacturing).

The work pieces (e.g., in a base semiconductor wafer) may comprise functional layers (e.g., at least one semiconductor device structure) of at least one semiconductor device, which is produced or applied at the surface or on the semiconductor wafer before the splitting method is carried out. The base wafer with the device structures subsequently may be split into a thinner device wafer, which includes the device structures, and a thinner reclaimed wafer. The reclaimed wafer may be processed, and further device structures may be produced within the reclaimed wafer. Optionally, the reclaimed wafer may be subjected to additional splitting processes as long as the thickness of the remaining reclaimed wafer is sufficient for further processing.

The features of the different semiconductor work piece splitting methods described herein are interchangeable unless expressly stated otherwise. Described next, with reference to the figures, are exemplary embodiments of the semiconductor work piece splitting methods, related apparatuses, and resulting work pieces. Some of the figures are explained in the context of a particular semiconductor work piece splitting method for ease of explanation and/or illustration. However, as explained above, the features of the different semiconductor work piece splitting methods are interchangeable unless expressly stated otherwise.

I. Non-Ablative Multi Beam Splitting

Non-ablative multi beam splitting includes at least two main steps, namely (i) a step of forming a separation zone within the semiconductor work piece, and (ii) a step of applying an external force or stress to the semiconductor work piece such that at least one crack propagates along the separation zone and the semiconductor work piece splits into two separate pieces. Thus, the separation zone facilitates separating the semiconductor work piece at a defined position. The separation zone can extent in a plane different to lattice structures or can substantially follow the lattice planes which may facilitate the propagation along the defined separation zone in the semiconductor work piece. Without a defined separation zone, it would be more difficult to separate the semiconductor work piece into two separate pieces in a reproducible manner which could result in more material losses (also referred to as kerf loss) during the splitting procedure. Moreover, a defined separation zone would be suitable for increasing the output of wafer processing because splitting of the semiconductor work pieces outside the separation zone may result in defective separated pieces, e.g., by vertically extending microscopic crack propagation instead of propagation within the separation zone. Therefore, some of the separated pieces could not be used or further processed in the next wafer processing steps because the thickness of the obtained pieces is not high enough. Therefore, the methods described herein increase efficiency of wafer processing and reduce costs in these processes.

In some embodiments, the step of forming a separation zone comprises modifying the semiconductor material of the semiconductor work piece at a plurality of targeted positions within the separation zone in at least one physical property which increases thermo-mechanical stress within the separation zone relative to the remainder of the semiconductor work piece. Generally, the step of modifying the semiconductor material in one of the targeted positions may comprise focusing at least two laser beams to the targeted position.

In line with the disclosure, focusing at least two laser beams to the targeted position means that two or more different laser beams are directed (i.e., focused) to a defined region within the semiconductor material at the same time. Each of the defined regions where the two or more laser beams overlap or are focused to is one of the targeted positions. Each targeted position, thus, is a region in which the energy intensity of the two or more laser beams is focused and increased by overlapping the two or more energy intensities of the laser beams. Therefore, this point is also called focal point. At the focal point of the two or more laser beams, i.e., at each of the targeted positions, the intensity of the two or more focused laser beams is high enough to modify the semiconductor material of the semiconductor work piece. In general, modification is caused by linear or nonlinear absorption of laser beam photons at the concentrated space within the focal point of the semiconductor material. The highly absorbed energy intensity at this focal point induces inhomogeneity or micro cracks in the semiconductor material.

While each laser beam has a low intensity before and after the focal point, laser and material interaction and modification is unlikely in the surrounding of the targeted positions, thereby reducing the interaction or modification of semiconductor material or other structures compared to using a focused single laser beam. More particularly, the adverse effects with nonlinear absorption of high energy photons and self-focusing along the propagation direction of a single laser beam is minimized when using two or more laser beams with low energy and focusing them at a targeted position. Modifications or damages in semiconductor material outside the targeted positions can be reduced by the at least two laser beam focusing method, thus resulting in a better reliability and lower kerf loss during the semiconductor wafer process.

In general, thermo-mechanical stress may be increased relative to the remainder of the semiconductor work piece by modifying the physical property of the semiconductor material in a specific region within the separation zone by focusing at least two laser beams to the targeted position within the separation zone. The modification of the physical property may be any inhomogeneity or microcrack induced by the high energy at the focal point. For example, the altered physical property may be a change in the lattice structure or crystallinity of the semiconductor material. This change in the lattice structure may include breaking some of the bonds of the lattice structure which can be considered as an additional chemical change of the semiconductor material. Nevertheless, such a chemical breakdown of some of the bonds within the lattice structure typically results in a change of the physical properties within this region. Therefore, in the following it is assumed that at least the modification of the physical properties results in an increase of thermo-mechanical stress at the targeted positions within the separation zone of the semiconductor work piece, thus simplifying the splitting of the semiconductor work piece into two separate pieces by applying an external force or stress to the semiconductor work piece in the subsequent step of the splitting method.

In some embodiments, the step of applying an external force or stress to the semiconductor work piece is carried out such that at least one crack propagates along the separation zone and the semiconductor work piece splits into two separate pieces. The external force applied may involve ultrasonic vibrations or application of a polymer layer, for example. An application of a polymer layer in combination with temperature modification is also sometimes referred to as Cold-Split technology. In an alternative embodiment, the thermo-mechanical stress generated within the separation zone may be sufficient to bring about the splitting of the semiconductor work piece without necessarily requiring application of an external force. For example, the internal stress may be so high that it is sufficient to propagate the microcracks generated at the targeted positions in the separation zone in the modification step within the total separation zone such that the semiconductor work piece finally split into two separate pieces.

In some examples of the method, the step of modifying the semiconductor material at the plurality of targeted positions comprises damaging the semiconductor material at each of the targeted positions within the semiconductor work piece. For example, in the case of SiC as the semiconductor material, the SiC material may be damaged by creating a plasma in the semiconductor material by means of focusing at least two laser beams to each of the targeted positions. The plasma may be generated by the high energy intensity at the focal point which results in a partial decomposition of the SiC semiconductor material, for instance, into Si and C by breaking Si—C bonds. Thereby, at least some of the atoms in the plasma may reform to carbon clusters and silicon material, e.g., in the form of amorphous carbon and/or amorphous silicon. In addition or as an alternative, at least some of the atoms may re-crystallize, semi-crystallize and/or re-organize, for example to at least one polytype of SiC (e.g., 4H—SiC, 6H—SiC, or 3C—SiC) or amorphous SiC where both Si and C phases are amorphous. Therefore, in some examples, damaging the semiconductor material by focusing at least two laser beams to each of the targeted positions involves creating an amorphous material or polycrystalline material or cavities (e.g., microcracks generated by SiC breakage) at the targeted positions within the semiconductor work piece. Any of the above-described modifications results in an altered physical property of the semiconductor material and, thus, weakening of the semiconductor material in the separation zone. Thus, the subsequent splitting of the semiconductor work piece within the separation zone is improved.

In at least one example, the method comprises the step of focusing at least two laser beams to the targeted position, wherein two or more coherent parallel laser beams are formed by one or more separate laser sources operating in a parallel mode, and the two or more laser beams are focused trough a condenser optics system to the targeted position. Thus, laser radiation of the two focused laser beams may be absorbed at the targeted position and may lead to the modification of the semiconductor material. In line with the general concept of the described method, this step may be applied at a plurality of targeted positions within the separation zone. In one example, an apparatus for applying the method as described above may comprise at least one means for focusing at least two laser beams to a targeted position within the separation zone. The apparatus may further comprise means for moving the at least two laser beams, thereby modifying a semiconductor material of the semiconductor work piece at a plurality of targeted positions within the separation zone in at least one physical property. When using two or more parallel laser beams, the laser beams may be focused trough a condenser optics system to each of the targeted positions. Examples of such condenser optics systems are lens systems, focus lenses, mirror systems, etc.

In some examples, a single laser source may be used and the step of focusing at least two laser beams to the targeted position comprises splitting a single laser beam emitted from a laser source into two or more partial and parallel laser beams. Exemplary splitting means may be diffractive optical elements or a beam splitter cube (e.g., a 50/50 beam splitter cube for dividing a beam into two beams with equal power, or a series of beam splitter cubes for dividing a beam into several beams with equal power, and/or a grating). Subsequently, the parallel partial laser beams may be focused through a condenser optics system. For example, the same condenser optics systems as describe beforehand can be used. When using a single laser source, the coherency of the laser radiation in each of the two or more parallel laser beams may automatically be given and does not need to be controlled by mechanical or optical means or an electronic control system such as a path delay to realize matching temporal superposition of the laser beams at the focal point.

When focusing these two or more coherent laser beams using the condenser optics system, the laser radiation that is applied to the separation zone may be in an off-resonant regime such that a probability of single-photon processes in the separation zone is small and mostly multi-photon processes (in particular, multi-photon absorption) may have to be accounted for. For example, the off-resonant regime may be achieved if the band gap of the separation zone is larger than (e.g., at least twice of or at least ten times of) the photon energy of the laser radiation at the focal point of the two or more laser beams. The sum of the photon energies of the two or more laser beams may be in the range of the band gap of the material within the separation zone. The laser radiation may be absorbed in the separation zone and may lead to further damage of the separation zone (e.g., decomposition of SiC in the case of a SiC semiconductor work piece), such that no or only a small mechanical force and/or thermal stress is needed to split the semiconductor work piece at the separation zone in a subsequent splitting step. In the case of a multi-photon process, damage creation may be further supported by a pre-defined layer (e.g., formed by ion implantation) that increases absorption within the region where the focal point of the laser radiation is positioned.

According to some examples, the at least two laser beams focused to the targeted position may comprise a ring-shaped intensity profile. By manipulating the beam distribution of a general laser beam from Gaussian intensity to a ring-shaped intensity profile, the focus at the focal point can be tightened. The ring-shape is also known as vortex, doughnut, or hallow beam profile. It can, for instance, be generated by a vortex lens, axicon, fork phase mask, spatial light modulator, or spiral phase plate. For each of the two or more beams, the intensity profile may be separately adjusted or at the same time. If the two or more laser beams are generated by a single laser beam (or seed laser beam) and subsequently split into the two or more parallel beams, it is sufficient if the intensity profile of the single laser beam is adjusted.

In yet another example, the at least two laser beams focused to the targeted position are operated in a pulsed mode. When using the pulsed mode, the laser radiation may be a pulsed laser radiation. The parameters of the laser radiation such as pulse duration, repetition rate, pulse energy, intensity, wavelength, pulse shape, polarization, etc. are interconnected and may be optimized according to a specific application or requirement. For example, the laser radiation may have a pulse duration of 100 fs to 100 ns (e.g., 50 ps to 10 ns), a repetition rate of 10 kHz to 10 MHz, a pulse energy of 100 nJ to 50 µJ, and a peak wavelength of 400 nm to 2100 nm (e.g., 900 nm to 1200 nm).

In at least some examples, the pulsed mode is operated in a single pulse mode or burst mode with two or more subpulses. As explained beforehand, the laser radiation may have a specific pulse duration, repetition rate, pulse energy, and peak wavelength adapted to the energy intensity to be applied by the two or more pulses of each laser beam at the same time at the focal point to generate the altered physical property at the targeted position. Instead of using single pulses in each of the two or more laser beams, each pulse may be divided into at least two (i.e., 2, 3, 4, 5, or more) subpulses which are applied to the focal point within one burst. This is also called burst mode. The burst mode may be used to further reduce the energy density within the laser beams so that multi-photon absorption takes place at the focal point, but not in the laser beam propagation direction before or behind the focal point. Burst mode operation may be realized using an electro-optical switch, e.g., including Pockels cell, to switch out the desired amount of pulses within one burst. Reducing energy density in the laser beams outside the focal point may reduce the probability of self-focusing beyond the focal plane due to Kerr effect and self-defocusing by plasma generation. The region of damaging the semiconductor material may, thus, be confined to the targeted positions only, thereby increasing efficiency of the splitting method and reducing overall costs due to higher quality of the wafers produced.

According to an example of the step of forming a separation zone carried out in the splitting methods described herein, the laser radiation may be applied along laser lines (also referred to as scribe lines) that run essentially parallel to one another. For each laser line, the at least two laser beams are scanned along the line. The speed of the laser scanning may be so fast that neighboring single laser shots (a shot is composed of at least two overlaying laser pulses or subpulses of the at least two laser beams) can be distinguished, e.g., do not overlap. Here, a single laser shot may correspond to the damage created by a single pulse of laser radiation of each of the at least two laser beams at the focal point.

According to another example, the semiconductor work piece is a semiconductor wafer and the method further comprises before the step of forming a separation zone within the semiconductor wafer as described above, the following steps: forming one or more epitaxial layers on the front side of the semiconductor wafer; forming a plurality of device structures in the one or more epitaxial layers; forming a metallization layer and/or a passivation layer over the plurality of device structures. In an optional step, a carrier may be attached to the semiconductor wafer with the one or more epitaxial layers, wherein the carrier is suitable to protect the plurality of device structures and mechanically stabilize the semiconductor wafer during and/or after the splitting process.

As in the former examples described herein, the semiconductor wafer may be any type of wafer used to produce semiconductor devices. For example, the semiconductor wafer may be a SiC wafer such as 4H—SiC and may have a thickness which may vary depending on wafer diameter. Typically, 4 inch and 6 inch SiC wafers have a thickness of 350 µm (microns) with an accuracy of, e.g., at most ±40 µm or at most ±25 µm. For larger SiC wafer diameters, the thickness may be higher. The wafer splitting process described herein may also be used with other SiC polytypes and/or other semiconductor materials, as explained above (e.g., Si, GaAs, GaN, sapphire, etc.), with corresponding adaptations of the process parameters.

Doping regions may be produced by implantation with subsequent annealing steps or by doping during the epitaxial process of the device structures. For example, a first deposited epitaxial layer may be an n-doped drain or emitter layer with a thickness ranging, e.g., between 10 µm and 50 µm for power MOSFET (metal-oxide-semiconductor field effect transistors) or power diode devices, or a p-doped emitter layer for IGBT (insulated gate bipolar transistor) devices. A second epitaxially deposited layer may be deposited as a buffer layer for preventing punch-through of the space charge layer towards the emitter/drain layer. The thickness of the buffer layer is typically 1 µm to 40 µm or 2 µm to 30 µm. A n-type drift zone layer may then be deposited by an epitaxial technique. The thickness of the drift zone layer depends on the target breakdown voltage (for 1200 V devices typically in the range between 8 µm and 12 µm and for 3.3. kV devices between 25 µm and 35 µm). The doping level of the drift zone layer also may be adjusted according to the desired breakdown voltage (for 1200 V devices typically about 1016 cm-3 and for 3.3 kV devices a few times 1015 cm-3). Front side device structures, such as p-body and source regions for power MOSFETs or IGBTs or p-emitter for power diodes, may be formed by masked ion implantation with subsequent annealing steps. For switchable devices, a gate structure may also be realized in the form of planar or trench-based gates.

After device formation, the semiconductor wafer has a front side with the device structures and a front side metallization layer and/or passivation layers. The device structures may be structures of a semiconductor device, for example a MEMS (microelectromechanical systems) and/or a MOEMS (micro-opto-electro-mechanical system) device, a diode such as an MPS (merged-pin-Schottky) diode, Schottky diode, MOS-gated diode, etc. or a transistor device such as a MOSFET, JFET (junction FET), IGBT, fin-FET, thyristor, etc. or a combination thereof. If the device structures include a Schottky contact, the front side metallization layer may include a Schottky contact metal. In addition or as an alternative, in the case of no Schottky contact, the front side metallization layer may include an Ohmic contact metal.

Optionally, a carrier which protects the device structures from damage and mechanically stabilizes the semiconductor wafer during and/or after the splitting process may be attached to the semiconductor wafer with the one or more epitaxial layers before or after forming the separation zone. The carrier may be a single piece of material or a carrier system that includes multiple layers and/or complex structures.

The shape of the carrier may be similar or even identical to the shape of the semiconductor wafer. The semiconductor wafer may have a flat cut into one or more sides for indicating the crystallographic planes of the wafer, whereas the carrier may not have such flats. The carrier may be a larger diameter than the semiconductor wafer, e.g., at least 0.1% larger. The diameter of the carrier may be, e.g., at most 3 times or at most 2 times or at most 1.5 times the diameter of the semiconductor wafer. Either a mechanically stabilizing part of the carrier and/or an optional fixing layer of the carrier may fully cover the front side of the semiconductor wafer. Alternatively, either the mechanically stabilizing part and/or an optional fixing layer of the carrier divide the front (active) side of the semiconductor wafer into sections along the surface of the wafer. According to this example, either the mechanically stabilizing part and/or an optional fixing layer of the carrier may have the shape of a ring, a grid, and/or may only be present in peripheral regions of the semiconductor wafer, e.g., an intersected ring at the outer/peripheral part of the wafer. In each case, the topography of the device structures may be embedded in the carrier, e.g., by a potting material and/or an adhesive layer and/or a non-adhesive layer between the carrier and the semiconductor wafer with the one or more epitaxial layers and the front side metallization.

The carrier may be either temporarily (reversibly) or permanently attached to the semiconductor wafer with the one or more epitaxial layers. In the case of temporary attachment, the carrier may include an adhesive tape having thermal or UV release, an adhesive (organic or inorganic composition) layer in combination with a rigid support such as a transparent substrate, non-transparent substrate, polymer film, etc., a fixed or mobile electrostatic chuck, a fixed or mobile vacuum chuck, a mobile vacuum carrier, etc. In the case of permanent attachment, the carrier may include hot embossed glass, e.g., in the form of a grid, a ring, etc., a glass grid and/or ring attached via solder glass, a glass grid and/or ring attached via a laser welding process, etc., a substrate such as a semiconductor, metal, insulator (e.g. glass) substrate joint to the semiconductor wafer with the one or more epitaxial layers via one or more diffusion soldering layers, a substrate joined to the semiconductor wafer with the one or more epitaxial layers via aerobic and or anaerobic adhesives or other binding components, etc.

The separation zone may be formed before or after the device structures are formed in line with the embodiments as described before, especially by using at least two laser beams focused to the targeted position at the same time. In some examples, a part of the separation zone may be formed before the device structures are formed, e.g., even before epitaxial growth, and another part of the separation zone may be formed after the device structures are formed. The position of the separation zone may be chosen such that, after defining the device structures, the distance to the front side of the semiconductor wafer with the one or more epitaxial layers is sufficiently high to allow for mechanical handling of the thinner device wafer which results from the splitting process, and such that the distance to the front side is sufficiently low and therefore the distance to the backside is sufficiently high so that the reclaimed wafer which results from the splitting process may still be processed. In one embodiment, the separation zone is close to the interface between the wafer and the first deposited epitaxial layer (substrate/drain layer for power MOSFETs or substrate/emitter layer for diodes). Typically, the distance between the separation zone and the interface between the wafer and the first deposited epitaxial layer is less than 10 µm or even less than 4 µm or even less than 2 µm.

In a further example, the step of focusing at least two laser beams to the targeted position within the separation zone is carried out from the side of the semiconductor wafer opposite to the epitaxial layers, the metallization and/or passivation layer and the optional carrier. In this case, the two or more laser beams may be directed from the backside of the semiconductor wafer such that the separation zone is formed by focusing the two or more laser beams close to the device structures to minimize the thickness of the remaining semiconductor layer underneath the device structures. As the energy density of the laser beams is high at the focal point in the targeted position, but low after the focal point, that means between the separation zone and the device structures, absorption phenomena in the semiconductor material or at the device structures or metallization layers are reduced to a minimum or cannot be detected. Thus, damages due to Kerr effect or self-defocusing by plasma generation within the laser beam propagation direction in the semiconductor material as observed in single-beam applications are minimized or can be avoided at all.

In one example, the external force applied to the semiconductor work piece for splitting the work piece along the separation zone comprises applying ultrasonic vibrations (sound waves) to the semiconductor work piece. The ultrasonic vibrations may have a frequency in the kHz regime, e.g., at least 20 kHz and at most 60 kHz (e.g., 30-50 kHz, e.g., 35-45 kHz). The semiconductor work piece may be placed in a container filled with a fluid such as pure water, deionized water, solvents in general, dimethylformamide, isopropyl alcohol, methanol, and/or ethanol when applying the ultrasonic vibrations. For example, a device similar to an ultrasonic cleaning apparatus may be used to apply the ultrasonic waves to the semiconductor wafer.

In another example of the splitting method, the external force or stress may be applied to the semiconductor work piece by applying pressure to the semiconductor work piece during the splitting of the semiconductor work piece into the two separate pieces. For example, after formation of the separation zone as described in one of the examples before, an external force is applied to the semiconductor work piece such that at least one large crack propagates along the separation zone and the semiconductor work piece splits into two separate pieces. The force equilibrium of surface energy, bonding forces and the external pressure are shifted in favor of the external force such that internal binding forces still present within the semiconductor work piece are overcome at the separation zone, thus resulting in crack propagation. The external force may be applied to aid the lift-off process during the splitting of the semiconductor work pieces. In the splitting method the step of applying the external force or stress to the semiconductor work piece may comprise applying a polymer to the semiconductor work piece, optionally on an intermediate carrier layer, wherein the polymer may have a coefficient of thermal expansion different from a coefficient of thermal expansion of the semiconductor work piece. Subsequently, a step of subjecting the polymer and the semiconductor work piece to a temperature process during which the polymer imparts mechanical stress to the semiconductor work piece may be carried out. Another example of applying the external force to the semiconductor work piece for splitting the semiconductor work piece along the separation zone comprises applying a polymer to the semiconductor work piece and/or a carrier provided on the semiconductor work piece. This technique is also sometimes referred to as Cold-Split technology. More particularly, the polymer has a CTE (coefficient of thermal expansion) different from a CTE of the semiconductor work piece. The polymer and the semiconductor work piece are then subjected to a temperature process during which the polymer imparts mechanical stress to the semiconductor work piece. The mechanical stress causes at least one large crack to propagate along the separation zone such that the semiconductor work piece splits into two separate pieces. In case the work piece, e.g., a semiconductor wafer, comprises device structures, one piece retains device structures and the other piece is available for subsequent device processing.

In the case of a semiconductor wafer as a semiconductor work piece, the polymer may be attached to the semiconductor wafer with a carrier already attached to the semiconductor wafer. The polymer may be attached at the backside of the semiconductor wafer that faces away from the front side and the carrier. The polymer instead may be attached to an outer side of the carrier which faces away from the semiconductor wafer. In this case, the carrier is located between the polymer and the semiconductor wafer. According to another embodiment, the polymer may be attached to both the backside of the semiconductor wafer and the outer side of the carrier. For example, if a glass grid or a glass ring is used as the carrier, the polymer may be applied at the backside of the semiconductor wafer with the one or more optional epitaxial layers and additionally at the outer side of the carrier. In general, a further layer (e.g., a bonding layer, such as an adhesive, and/or a layer that simplifies later removal of the polymer) may be applied between the polymer and the side at which the polymer is applied.

The polymer may be selected based not only CTE, but also by considering multiple parameters. The CTE of the polymer should be different from the CTE of the semiconductor work piece. For example, the CTE of the polymer is preferably larger than the CTE of the semiconductor work piece. In addition to the CTE difference, the linear course of the CTE in the polymer over a wide temperature range may be advantageous for successful separation.

Furthermore, the polymer may be adapted in its thermal conductivity by using fillers such as ZnO and/or carbon black mixed into the polymer material before the temperature process. Some pre-processing or conditioning to allow for damage-free polymer removal may increase the efficiency of a Cold-Split process. For example, a foil may be positioned between the polymer and the surface to which the polymer is attached.

Attaching the polymer is typically performed at higher temperatures (e.g., above room temperature but below 300° C.). A binding process may be applied to allow for a firm bond throughout the entire temperature process. For example, before applying the polymer, the application surface of the polymer and/or semiconductor work piece and/or carrier may undergo chemical and/or physical surface treatment (for example, with a plasma) to allow for firm bonding. An indirect temporary cold plasma activation process may be used to ensure subsequent easy removal of the polymer. This has the advantage that ambivalent characteristics of the structure-property relationships are achievable here and that no significant thermal diffusion processes are to be expected at the low temperatures that occur. Diffusion may, e.g., be problematic in the case of metallic impurities, such as impurities originating from metallic layers of the device structures. The polymer binding is sufficient for execution of the splitting operation, but sufficiently weak for complete removal of the polymer in subsequent steps.

Another additional or alternative approach is to apply a binding (sacrificial) layer between the semiconductor work piece with the one or more epitaxial layers (and/or, if applicable, carrier) and the polymer. The binding layer may be chosen such that adhesion to the polymer can be reduced, e.g., with chemicals or with thermal treatment.

The polymer may not be produced directly on the semiconductor work piece with the one or more epitaxial layers and/or directly on the carrier. Rather, the polymer may be pre-produced and subsequently attached to the semiconductor work piece with the one or more epitaxial layers and/or carrier. In other embodiments, the polymer is produced directly on the semiconductor work piece with the one or more epitaxial layers and/or carrier, e.g., via spraying or coating.

After attaching the polymer to the semiconductor work piece with the one or more epitaxial layers and/or carrier, the temperature process is carried out. In one embodiment, the temperature process is selected such that the polymer undergoes a partial glass transition and a partial crystallization during the temperature process. This may include a first phase during which the polymer and the semiconductor work piece undergo a temperature gradient from a starting temperature down to room temperature, the starting temperature being 300° C. or less but above room temperature, and a second phase during which the polymer and the semiconductor work piece are further cooled down to a lower temperature. For example, the lower temperature may correspond to ±40° C. of a boiling temperature of a cooling liquid (e.g., liquid nitrogen) used for cooling. The lower temperature may be, for example, −170° C., for the entire semiconductor work piece. In some examples, the lower temperature may be below a glass transition temperature (Tg) of the polymer, depending on the cooling conditions (e.g., the cooling liquid).

After the splitting of the semiconductor work piece, the piece which retains the device structures may be thinner than the other piece. For example, the piece which retains the device structures may have a thickness of at most 100 μm (e.g., at most 70 μm or at most 50 μm) and at least the required thickness of the drift zone as described above (or at least 10 μm more than the required thickness) and the other piece may have a thickness of at least 150 μm (e.g., at least 190 μm), wherein the thickness of the other piece shall be sufficient for further device processing steps.

According to an example, the splitting method further comprises, after the semiconductor work piece is split into the two separate pieces, a processing step for reducing a surface roughness of a separation surface of both pieces of the semiconductor work piece, each separation surface being a surface formed as the at least one crack propagates along the separation zone. For the backside of the piece with optional device structures, a damage removal, e.g., by mechanical grinding and/or chemical mechanical polishing and/or etching may be performed. The final roughness of the separation surface after damage removal may have a root-mean-square (rms) value below 5 μm or even below 2 μm. Further processing may then follow. In the case of the piece without device structures, the separation surface may need processing to be ready for subsequent epitaxial growth. In this case, the rms value of the separation surface may be below 500 nm or even below 300 nm. The thickness of the piece without the device structures may be adapted to the original thickness of the work piece, e.g., by means of deposition techniques such as CVD-epitaxial techniques, so that the same procedure as described above can be repeated several times for the thickened pieces.

In the case of the separation zone including several microscopic cracks generated by focusing at least two laser beams to a plurality of targeted positions, the mechanical stress imparted to the semiconductor work piece causes microscopic cracks to connect to one another to form a large crack which splits the semiconductor work piece. That is, the individual microscopic cracks shift with respect to one another in response to the external force. The separation zone may thus not be viewed as a single layer or plane within the semiconductor work piece, but rather a combination of several microscopic cracks that are only combined during the splitting. In case the semiconductor work piece is a SiC wafer or a SiC boule, the at least one crack formed by applying an external force or stress to the semiconductor work piece, thus combining the microscopic cracks, has a saw-tooth pattern. That means, both separate pieces have a separation surface with a saw-tooth pattern. The resulting device piece and the reclaimed piece thus do not have a smooth planar surface in the case of SiC. In one embodiment, after the semiconductor work piece is split into the two separate pieces, each separation surface which results from the large crack propagating along the separation zone is smoothed as described above. Residual decomposed material may be present at the separation surface of each piece split from the semiconductor work piece and may be removed by a cleaning process.

In an additional or alternative example, the method comprises the splitting of a semiconductor work piece, wherein the semiconductor work piece is a semiconductor wafer comprising one or more epitaxial layers at a front side thereof having a plurality of device structures in the one or more epitaxial layers, and a metallization layer and/or a passivation layer over the plurality of device structures. A separation zone is generated by focusing at least two laser beams to each of the targeted positions in the separation zone, wherein the surface of the rear side of the semiconductor wafer or the front side of the semiconductor wafer comprising the one or more epitaxial layers is not substantially damaged by the laser beams. As the energy density at the focal point formed by the at least two laser beams is high due to resonance effects, the semiconductor material at the targeted position can be modified or damaged. However, before or after the focal point, the energy density of the two or more laser beams is not sufficient to be absorbed in the semiconductor material and, thus, the laser beams will not affect the semiconductor material or the device structures outside the targeted position. Thereby a reliable method of generating a separation zone within a semiconductor wafer comprising several device structures is obtained. Lower damages at the rear and front side surfaces of the wafer, especially those already encompassing device structures, increase the efficiency of the wafer processing method as well as reduces the costs of wafer processing due to lower products with surface damages. Moreover, as explained above, this method allows producing semiconductor wafers having a surface substantially free of stray light defects at the surface of the epitaxial layers on the semiconductor wafer.

Furthermore, a semiconductor work piece comprising a separation zone having a plurality of targeted positions with at least one modified physical property of the semiconductor material defining a modification zone bidirectionally extending substantially parallel to a surface of the semiconductor work piece is provided. The semiconductor work piece may be manufactured with at least some of the method steps described herein. Thus, the modification zone may be generated by focusing at least two laser beams to each of the targeted positions. For example, two or more different laser beams are directed (i.e., focused) to one of the defined regions, i.e., to one of the targeted positions, within the semiconductor material at the same time. This process is then repeated for the plurality of targeted points within the modification zone. Each of the targeted positions, thus, is a region in which the energy intensity of the two or more laser beams is focused to and increased by overlapping the two or more energy intensities of the laser beams at the focal point. As the focal point of the two or more laser beams is a small focal spot concentrated within the crossing point of the two or more laser beams, the extension of the modification zone in laser propagation direction is rather low compared to a single-beam laser focusing method. Hence, the thickness of the modification zone and, thus, of the separation zone, can be adjusted at a rather low level of less than 30 μm, sometimes, less than 20 μm or less than 15 μm. Such a small thickness of the modification zone allows a well-defined splitting in a subsequent splitting step and lowers the kerf loss during wafer manufacturing.

Modifications or damages in semiconductor material outside the targeted positions in the separation zone can further be reduced by the at least two laser beam focusing method, thus resulting in a better reliability and lower kerf loss during a splitting and further processing of these semiconductor work pieces such as semiconductor wafers.

FIGS. 1A through 1D illustrate an embodiment of the non-ablative multi beam splitting method. The embodiment includes forming a separation zone within a semiconductor work piece by focusing at least two laser beams to targeted positions within the semiconductor work piece and applying an external force or stress to the semiconductor work piece such that at least one crack propagates along the separation zone and the semiconductor work piece splits into two separate pieces.

FIG. 1A illustrates the irradiation of a semiconductor work piece 100 (e.g., a SiC wafer or SiC ingot) with a first laser beam 22 and a second laser beam 24. The first and second laser beams 22, 24 are guided through a condenser optics system 35. The condenser optics in this embodiment is an f theta lens adjusted to focus the two laser beams 22, 24 (e.g., running parallel to another) to the targeted position, i.e., the focal point 10. In other embodiments, more than two laser beams may be focused to the targeted position. Typically, the two laser beams 22, 24 (or, in other embodiments, more than two laser beams) are focused to a single targeted position, i.e., a single focal point 10.

At the focal point 10, the energy intensities of the two laser beams 22, 24 are focused and increased by constructive interference of the interaction of the respective waves of the two laser beams 22, 24. The energy density absorbed by the semiconductor material at the focal point 10 due to the superposition effect of the respective correlated or coherent waves is high enough to modify the semiconductor material of the semiconductor work piece 100. Modification in this embodiment includes modifying semiconductor material of the semiconductor work piece 100 within the separation zone 120 in at least one physical property which increases thermo-mechanical stress within the separation zone 120 relative to a remainder of the semiconductor work piece 100. The increased thermo-mechanical stress within the separation zone 120 may lead to micro cracks 12 in the semiconductor material as shown in FIG. 1B.

Even though FIGS. 1A and 1B show only overlapping the respective focal points of two laser beams 22, 24 at the single focal point 10, more than two laser beams can be overlapped in a single focal point 10, thereby further reducing the energy deposited into the semiconductor material outside the focal point 10.

Moving the laser irradiation apparatus over the semiconductor work piece 100 and/or moving the semiconductor work piece 100 under the laser irradiation apparatus allows the irradiation and modification of the semiconductor work piece 100 at several targeted positions 10. In FIG. 1B, the moving direction of the laser irradiation apparatus relative to the semiconductor work piece 100 is shown a horizontal arrow. A chuck holding the semiconductor work piece 100 and/or the laser irradiation apparatus may be moved to irradiate the semiconductor work piece 100 at the targeted positions 10.

In FIG. 1C, the semiconductor work piece 100 is shown in a cross-sectional view. Several microcracks 12 generated by the focusing of the at least two laser beams 22, 24 are shown. The plane in which the microcracks 12 are generated is defined as the separation zone 120. When a plurality of microcracks 12 have been generated in the separation zone 12, an external force 140 may be applied to the semiconductor work piece 100, e.g., at the surface of the semiconductor work piece 100. An example is a so-called 'cold-split' process which includes using a polymer layer with different CTE of the polymer and the semiconductor material. Alternatively, an ultrasonic vibration and/or pressure may be applied as the external force or stress 140 to the semiconductor work piece 100 in this step.

The separate microcracks 12 in the separation zone 120 of the semiconductor work piece 100 are formed in this embodiment not within an exact plane (cf. FIG. 1C). In SiC semiconductor materials, the lattice structure mostly is inclined by 4 degrees to the surface of the SiC wafer or SiC boule. More particularly, the stress applied by the modification of the semiconductor material at the focal point 10 damages the semiconductor material (e.g., by plasma formation or decomposition of the Si—C-bonds in the lattice) and may generate microcracks 12. These microcracks 12 generally extend in the direction of the lattice structure and not necessarily in the direction of the laser beam extension at the focal point. Therefore, the separation zone 120 may comprise, as shown in FIG. 1C, a plurality of separated microcracks which are inclined to the plane of the separation zone 120, e.g., by 4 degrees.

Regardless of the inclined arrangement of the microcracks 12, the applied external force or stress 140 applied to the semiconductor work piece 100 causes at least one crack to propagate along the separation zone 120 such that the semiconductor work piece splits along the defined separation zone plane into a first separated semiconductor piece 110 and a second separated semiconductor piece 130, as shown in FIG. 1D. Thus, the surface of the first and second semiconductor pieces 110, 130 after the splitting process of a SiC semiconductor wafer or ingot is not even but in the form of a saw-tooth pattern. Further finishing process steps can be applied to the two separated semiconductor pieces 110, 130, such as, e.g., smoothing the surfaces by polishing the saw-tooth patterned surfaces and/or providing the separated pieces 110, 130 with devices structures or epitaxial layers.

After the semiconductor work piece 110 is split into the two separate pieces 110, 130, a surface roughness of a separation surface 111, 113 of both of the two separate pieces 110, 130 may be reduced, where each separation surface 111, 113 is a surface formed as the at least one crack propagates along the separation zone 120. For the backside of the piece 110/130 with optional device structures, a damage removal, e.g., by mechanical grinding and/or chemical mechanical polishing and/or etching may be performed. The final roughness of the separation surface 111, 113 after damage removal may have a root-mean-square (rms) value below 5 µm or even below 2 µm. Further processing may then follow. In the case of the piece without device structures, the separation surface 111/113 may need processing to be ready for subsequent epitaxial growth. In this case, the rms value of the separation surface 111/113 may be below 500 nm or even below 300 nm. The thickness of the piece 110/130 without the device structures may be adapted to the original thickness of the work piece, e.g., by means of deposition techniques such as CVD-epitaxial techniques, so that the same procedure as described above can be repeated several times for the thickened pieces.

As it is apparent from the above-described embodiment of the method of the non-ablative multi beam splitting method, this method may be applied to split a thin semiconductor wafer from a semiconductor boule for further processing the semiconductor wafers. In addition or alternatively, this method may be applied to split an already processed semiconductor wafer including epitaxial layers and device structures into two wafers such that a thin semiconductor layer below the epitaxial layer with the device structures is formed in the first piece of the wafer and a second piece with sufficient thickness for epitaxial growth of device structures may be obtained.

In one embodiment, the semiconductor material of the semiconductor work piece 100 is modified in a targeted position 10 by damaging the semiconductor material by creating a plasma in the semiconductor material at the targeted position, by focusing at least two laser beams 22, 24 to the targeted position 10. In the case of SiC semiconductor material, the plasma may be generated by the high energy intensity at the focal point 10 which results in a partial decomposition of the SiC semiconductor material, for instance, into Si and C by breaking Si—C bonds. Thereby, at least some of the atoms in the plasma may reform to carbon clusters and silicon material, e.g., in the form of amorphous carbon and/or amorphous silicon. In addition or as an alternative, at least some of the atoms may re-crystallize, semi-crystallize and/or re-organize, for example to at least one polytype of SiC (e.g., 4H—SiC, 6H—SiC, or 3C—SiC) or amorphous SiC where both Si and C phases are amorphous. Therefore, in some examples, damaging the semiconductor material by focusing at least two laser beams 22, 24 to each of the targeted positions 10 involves creating an amorphous material or polycrystalline material or cavities (e.g., microcracks generated by SiC breakage) at the targeted positions within the semiconductor work piece. Any of the above-described modifications results in an altered physical property of the semiconductor material and, thus, weakening of the semiconductor material in the separation zone 120. Thus, the subsequent splitting of the semiconductor work piece 100 within the separation zone 120 is improved.

Figure 2:
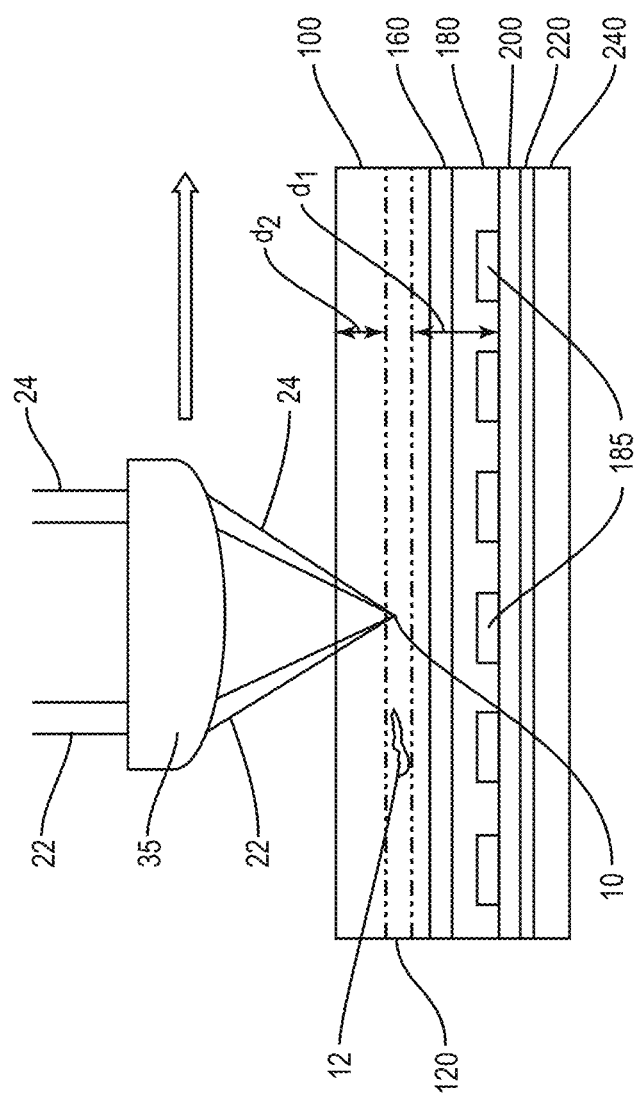
FIG. 2 illustrates another embodiment of a method step of generating a separation region in a semiconductor work piece with devices structures.

FIG. 2 illustrates another embodiment of the non-ablative multi beam splitting method. A semiconductor work piece 100, e.g., a SiC semiconductor wafer, is first provided with device structures by implantation with subsequent annealing steps or by doping during the epitaxial growth process. For example, a first deposited epitaxial layer 160 may be an n-doped drain or emitter layer with a thickness ranging, e.g., between 10 μm and 50 μm for power MOSFET or power diode devices, or a p-doped emitter layer for IGBT devices. A second epitaxially deposited layer may be deposited as a buffer layer for preventing punch-through of the space charge layer towards the drain or emitter layer 160. The thickness of the buffer layer is typically 1 μm to 40 μm. A n-type drift zone layer 180 may then be deposited by an epitaxial technique. The thickness of the drift zone layer 180 depends on the target breakdown voltage (for 1200 V devices typically in the range between 8 μm and 12 μm and for 3.3 kV devices between 25 μm and 35 μm). The doping level of the drift zone layer 180 also may be adjusted according to the desired breakdown voltage (for 1200 V devices typically about 1016 cm-3 and for 3.3 kV devices typically a few times 1015 cm-3). Front side device structures 185, such as p-body and source regions for power MOSFETs or IGBTs or p-emitter for power diodes, may be formed by masked ion implantation with subsequent annealing steps. For switchable devices, a gate structure also may be realized in the form of planar or trench-based gates.

After device formation, the semiconductor workpiece 100 (e.g., a semiconductor wafer) has a front side with the device structures 160, 180, 185 and front side metallization and/or passivation layers 200. The device structures may be structures of a semiconductor device, for example a MEMS (microelectromechanical systems) and/or a MOEMS (micro-opto-electro-mechanical system) device, a diode such as an MPS (merged-pin-Schottky) diode, Schottky diode, MOS-gated diode, etc. or a transistor device such as MOSFET, JFET (junction FET), IGBT, fin-FET, thyristor, etc. or a combination thereof. If the devices structures include a Schottky contact, the front side metallization layer 200 may include a Schottky contact metal. In addition or as an alternative in the case of no Schottky contact, the front side metallization layer 200 may include an Ohmic contact metal.

A carrier layer 240 which protects the device structures from damage and mechanically stabilizes the semiconductor wafer during and/or after the splitting process may be attached to the semiconductor wafer with the one or more epitaxial layers before or after forming the separation zone 120. The carrier layer 240 may be a single piece of material or a carrier system that includes multiple layers and/or complex structures. The topography of the device structures may be embedded in the carrier layer 240, e.g., by a potting material and/or an adhesive layer and/or a non-adhesive layer 220 between the carrier layer 240 and the semiconductor work piece 100 with the one or more epitaxial layers 160, 180, 185 and the front side metallization layer 200.

The separation zone 120 within the semiconductor work piece 100 may be formed before or after for the device structures 160, 180, 185 are formed in line with the embodiments as described before, especially by using at least two laser beams 22, 24 focused to each of the targeted positions 10 at the same time. The position of the separation zone 120 may be chosen such that, after defining the device structures 160, 180, 185, the distance d1 to the front side of the semiconductor work piece 100 with the one or more epitaxial layers is sufficiently high to allow for mechanical handling of the thinner device wafer which results from the splitting process, and such that the distance d1 to the front side is sufficiently low and therefore the distance d2 to the backside is sufficiently high so that the reclaimed wafer which results from the splitting process may still be processed. In one embodiment, the separation zone 120 is close to the interface between the semiconductor work piece 100 and the first deposited epitaxial layer 160. Typically, the distance between the separation zone 120 and the interface between the semiconductor work piece 100 and the first deposited epitaxial layer 160 is less than 10 μm or even less than 4 μm or even less than 2 μm.

In the embodiment of FIG. 2, the step of focusing at least two laser beams 22, 24 to the targeted position 10 within the separation zone 120 is carried out from the side of the semiconductor wafer 100 opposite to the epitaxial layers 160, 180, 185, the metallization and/or passivation layer 200 and the optional carrier layer 240. In this case, the two or more laser beams 22, 24 may be directed from the backside of the semiconductor work piece 100 such that the separation zone 120 is formed by focusing the two or more laser beams 22, 24 close to the device structures 160, 180, 185 to minimize the thickness of the remaining semiconductor layer underneath the device structures. As the energy density of the laser beams 22, 24 is high at the focal point in the targeted position, microcracks 12 are formed within the well-defined separation zone 120 having a low thickness of less than 30 μm (sometimes less than 20 μm or less than 15 μm). The energy density after the focal point, that means between the separation zone 120 and the device structures 160, 180, 185, however, is rather low. Thus, linear or non-linear laser beam energy absorption phenomena in the semiconductor material, but outside the focal point 10, or at the device structures 160, 180, 185 or metallization layers 200 are reduced to a minimum or cannot be detected. Especially, the device structures 160, 180, 185 and the metallization layer 200 are substantially not affected by the laser beams 22, 24 as the energy level outside the focal point 10 is too low as to significantly modify the physical or chemical properties of the materials of these layers. Hence, the method as described in this embodiment allows the formation of semiconductor work pieces 100 having a well-defined separation zone 120 with a thickness in an axis perpendicular to the bidirectional extension of the modification zone of less than 30 µm. Moreover, the above-described embodiment of a method of generating a well-defined separation zone 120 in a semiconductor work piece 100 as a preparatory step for subsequent splitting of the semiconductor work piece 100 allows the formation of semiconductor wafers with one or more epitaxial layers (with optional further device structures) having a surface which is substantially free of stray light defects caused by self-phase modulation effects in the laser beam propagation direction. Substantially free means in this regard less than $1 \times 10^{-4}$ or less than $1 \times 10^{-5}$ stray light defects per 1 $cm^2$ at the surface of the epitaxial layers 160, 180, 185 on the semiconductor work piece 100 after the finishing process steps such as removing carrier layer 240. This increases quality of manufactured chips per wafer due to less damaged chips during the manufacturing process, that means, higher efficiency and lower costs of the overall process.

Figure 3:
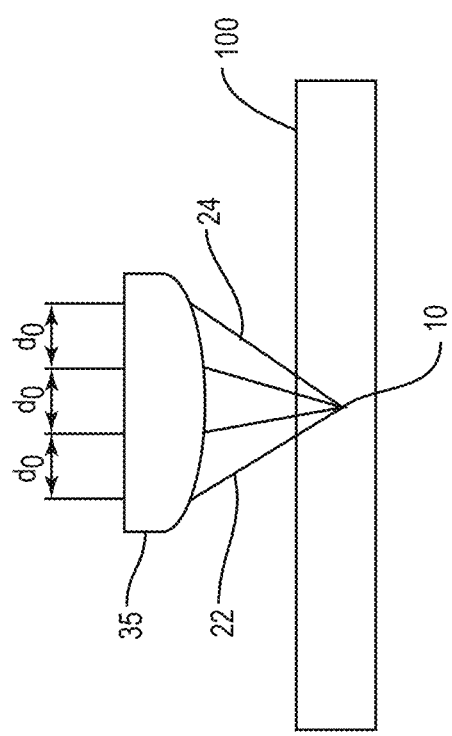
FIG. 3 illustrates an exemplary embodiment of a laser beam focusing arrangement.

FIG. 3 illustrates an exemplary embodiment of a laser beam focusing arrangement. In this embodiment, two identical pulsed laser beams 22, 24 are guided through one lens 35, e.g., a lens with low NA (numerical aperture), to focus the two laser beams 22, 24 with low energy densities. Both laser beams 22, 24 have a Gaussian profile (other profiles are also applicable) with a diameter d0 (d0 measured at half height of the Gaussian profile). Both laser beams 22, 24 are spaced apart by about the same diameter of one individual beam, i.e., space between laser beam 22 and laser beam 24 is about d0, to improve the use of the lens 35. If the space between the two laser beams is identical to the diameter of the laser beams, that means is d0, a maximum efficiency of the arrangement may be expected. The same applies if more than two laser beams are focused by one lens. Then the distance between each of the three or more laser beams may be in the same range as the diameter of each of the identical pulsed laser beams.

In this embodiment, identical pulsed laser beams 22, 24 are used. Identical means that the two or more laser beams 22, 24 are coherent and parallel. This enables that a superimposed pulse energy by positive interference of the respective waves of the laser beams 22, 24 is applied at the focal point 10 which is the sum of the two or more individual laser beams 22, 24 guided through the lens 35. For this embodiment, a 'twinning' or dual beam designed laser using TEM01 (transverse electric mode 01) or TEM10 (transverse electric mode 10) may be used to deliver a double beam.

In this embodiment or in an alternative embodiment, an apparatus for defining a separation zone 120 within a semiconductor work piece 100 may be used comprising at least one means 35 for focusing at least two coherent laser beams 22, 24 to a targeted position 10 within the separation zone 120, and means for moving the at least two coherent laser beams 22, 24 (not shown; moving direction shown by the horizontal arrow in FIG. 1B), thereby modifying a semiconductor material at a plurality of targeted positions 12 within the separation zone 120 in at least one physical property.

Figure 4:
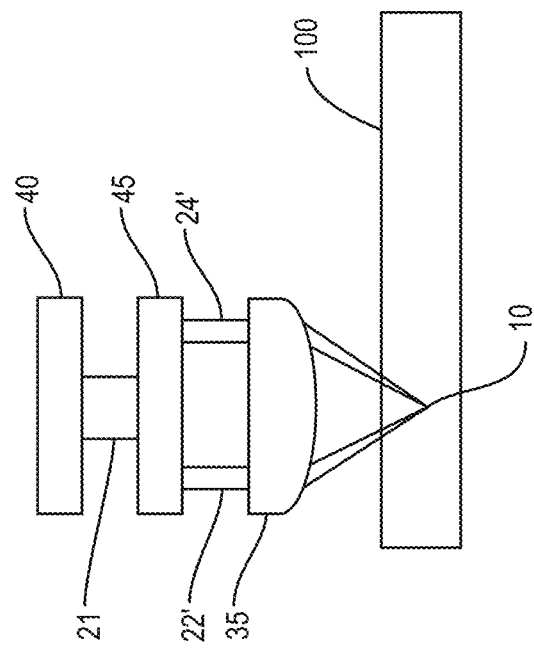
FIG. 4 illustrates another exemplary embodiment of a laser beam focusing arrangement.

As illustrated in FIG. 4, the apparatus may further comprise a laser source 40 emitting a single laser beam 21. Furthermore, the apparatus may comprise means 45 for splitting the single laser beam 21 into two or more partial laser beams 22', 24' which are then focused to the targeted position 10 within the separation zone 120 by lens 35. The two laser partial beams 22', 24' generated in the laser beam splitter 45 (e.g., a diffractive optical element or a 50/50 beam splitter cube, optionally with a path delay) generally are two identical parallel laser beams 22', 24'. The splitting of a single laser beam 21 for producing the two or more partial laser beams 22', 24' (as shown in the laser beam arrangement of FIG. 4) generally is able to form coherent laser beams so that further means for adjusting the pulses of the two partial laser beams 22', 24' is not necessary in this embodiment. If the coherency is not given, path delay means to realize matching temporal superposition of the wave beams at the focal point 10 may be used. Efficiency of the apparatus and of the whole irradiation process can, thus, be further improved with low costs and high reliability.

Figure 5:
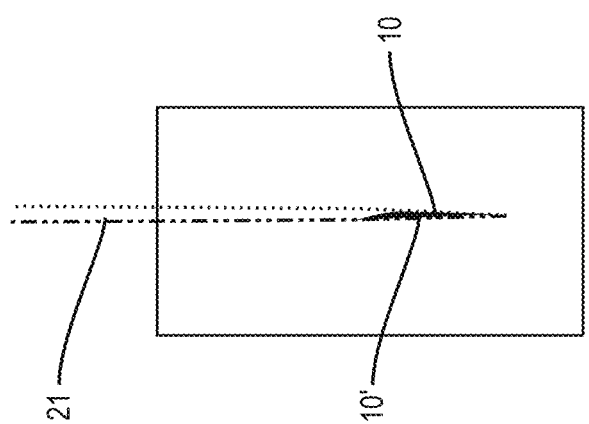
FIG. 5 illustrates the energy distribution at the focal point in a single-beam process.

FIG. 5 illustrates the energy distribution at the focal point 10' in a single-beam process. The focal point or spot 10' for a focused single laser beam 21 is elongated and the length of the focal point 10' in direction of the laser beam propagation highly depends on the depth of the focal point 10' in the semiconductor material. The length is higher in deeper areas and is in the range of at least 10-20 µm (at a focal point in about 100 µm depth) to 100 µm or more (at a focal point in about 700 µm depth) depending on the depth of the focal point.

Figure 6:
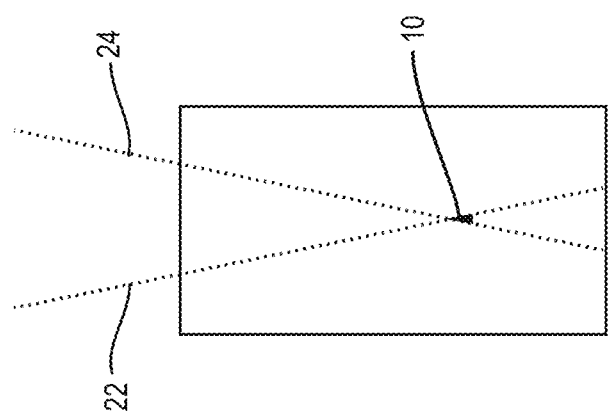
FIG. 6 illustrates the energy distribution at the focal point in a twin-beam process.

In contrast to the focal points or spots in single-beam processes, the intensity profile at the focal spot in the technique with focusing two or more laser beams 22, 24 at one focal point 10 is quite different. FIG. 6 illustrates the energy distribution at the focal point 10 in an exemplary twin-beam process. The focal point 10 has an elongated profile, but the energy distribution at the focal point 10 is in the range of 2 to 5 µm (independently of the depth of the focal point in the semiconductor material). Therefore, the energy for modifying the semiconductor material is reduced to a very small area in this embodiment as shown in FIG. 6 compared to the single-laser beam technique (FIG. 5). Especially the elongation of the focal point 10 in direction of the laser beam irradiation is quite different so that a well-defined modification zone to be generated in substantial perpendicular direction to the general laser beam irradiation of the two laser beams 22, 24 in the separation zone 120 of the semiconductor work piece 100 can be achieved. The small thickness of the modification zone reduces kerf loss during semiconductor wafer manufacturing and may reduce overall costs of the wafer manufacturing processes.

Figure 7:
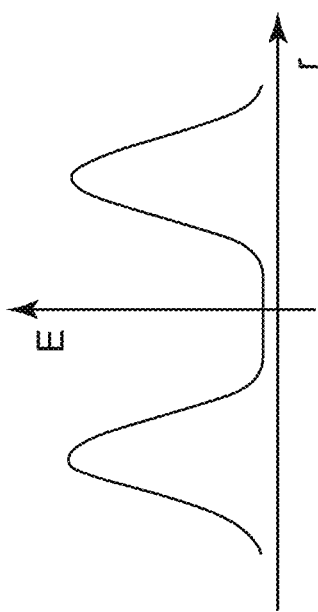
FIG. 7 illustrates an energy diagram in a laser beam with Gaussian intensity profile.

In the above-described embodiments, laser beams with a Gaussian intensity profile may be used. FIG. 7 illustrates an energy diagram with a Gaussian intensity profile of the laser beam. According to this profile, the energy density in the middle of the laser beam is highest. With increasing radius, the energy is continuously reduced along with a Gaussian function.

Figure 8:
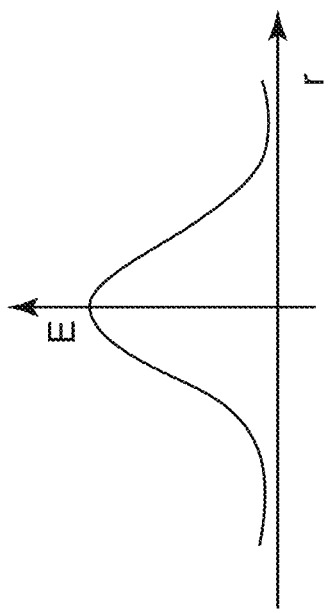
FIG. 8 illustrates an energy diagram in a laser beam with ring-shaped intensity profile.

Alternative laser beams with other energy distribution profiles may be used in the herein describe embodiments. One exemplary alternative is shown in FIG. 8 which illustrates an energy diagram in a laser beam with ring-shaped intensity profile. Such kind of energy profiles are also called vortex, doughnut or hallow beam profiles. Energy maxima are present at the outer rim of the laser beam while the energy intensity in the middle of the laser beam is nearly zero.

Generally, a Gaussian intensity profile laser beam may be manipulated to a ring-shaped intensity profile laser beam by suitable common diffractive, optical or mechanical means. Examples are vortex lenses, axicons, fork phase masks, spatial light modulators, or spiral phase plates. Using ring-shaped intensity profile laser beams allows a further tightening of the focal point in the above-described methods and apparatuses. The use of ring-shaped laser beams in the methods with focusing two or more laser beams to a focal point at the targeted region allows high energy intensities formed just at the focal point, with low energy densities outside the focal point. Moreover, a further tightening of the focal spot by the specific ring-shaped laser beam profile may be achieved, thus further improving efficiency of the methods described herein. Furthermore, lower energies outside the focal point further reduce the energy density and enables using a metal layer on laser entrance backside or minimize damage zone during SiC wafer or boule splitting processes as described herein in detail. Beam shaping may also be applied to reduce optical aberration or unwanted surface ablation or optimizing the depth of field.

Figure 9:
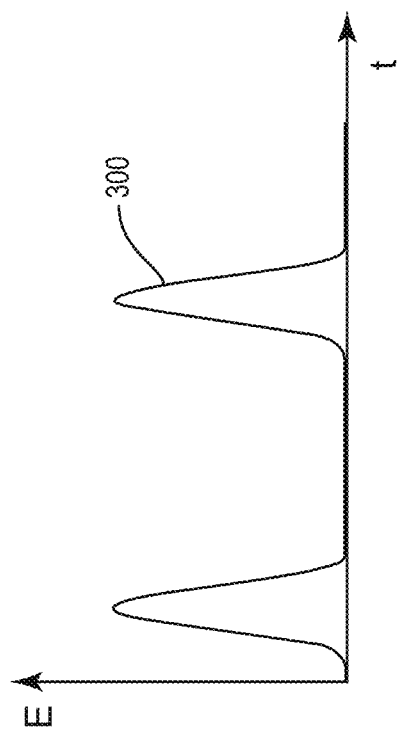
FIG. 9 illustrates an energy diagram in a single pulse mode process.

Managing thermal heat loading and reducing energy density during industrial non ablative laser irradiation applications may be achieved by burst mode applications. Generally, the laser beams used in the above-described methods and apparatuses are generated by pulsed laser sources. The pulsed laser beams may be single pulsed laser beams as illustrated in the energy diagram of exemplary embodiment shown in FIG. 9. The energy intensity of one single pulse 300 is the area under each of the pulses 300. Pulse intervals suitable for the applications as described herein are in the range of 100 fs to 100 ns and pulse energies in the range of 100 nJ to 50 µJ.

Figure 10:
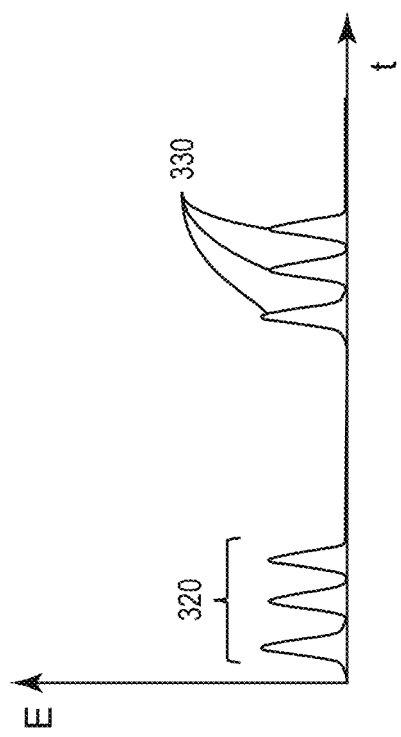
FIG. 10 illustrates an energy diagram in a burst pulse mode process.

FIG. 10 illustrates the energy diagram of an alternative embodiment in which a burst pulse mode process is shown. The burst mode operation uses several subpulses 330 (in this example three subpulses) per burst 320. The sum of the areas below the subpulses 330 of each burst 320 is the pulse or burst energy. Usually the intervals of bursts 320 (divided into three subpulses 330 in this example) and the energy intensities of each burst 320 are the same as in the single pulse mode, namely in the range of 100 fs to 100 ns for the intervals between the bursts 320 and 100 nJ to 50 µJ for the burst energy. Suitable time intervals between each subpulse in a series of subpulses 330 are in the range of about 10 to 50 ns or about 20 to 40 ns or about 25 ns. The burst mode operation may be realized using an electro-optical switch including Pockels cell to switch out the desired number of pulses within one burst. The burst mode allows to reduce the energy density within the semiconductor material or the device structures or epitaxial layers in the above-describes splitting methods, while maintaining the high energy density at the focal point when two or more laser beams are focused to each of the targeted regions in the separation zone of a semiconductor work piece.

The non-ablative multi beam splitting examples and embodiments previously described herein involve splitting a new wafer from a base semiconductor wafer. Alternatively, the splitting techniques described herein may be applied to splitting semiconductor wafers from a semiconductor boule or ingot. A semiconductor boule is a single crystal ingot produced by a synthetic means such as the Bridgman technique, the Czochralski process, etc. Semiconductor boules are cropped and ground to an off-orientation and the outer diameter is ground to form an ingot.

For SiC boules, for example, a vapor deposition process is typically used. The non-ablative multi beam splitting techniques described herein may be applied to splitting semiconductor wafers from a semiconductor boule by forming a separation zone within a semiconductor boule, the separation zone having at least one altered physical property which increases thermo-mechanical stress within the separation zone relative to the remainder of the semiconductor boule. For example, thermo-mechanical stress may be increased within the separation zone by focusing two or more laser beams at a targeted position within the semiconductor boule. An external force is then applied to the semiconductor boule such that at least one crack propagates along the separation zone and a wafer splits from the semiconductor boule. In one embodiment, an external force is applied to the semiconductor boule by applying a polymer to the semiconductor boule, the polymer having a CTE different from a CTE of the semiconductor boule. The polymer and the semiconductor boule are subjected to a temperature process during which the polymer imparts mechanical stress to the semiconductor boule. The thermo-mechanical stress generated within the separation zone of the semiconductor boule may be sufficient to bring about wafer splitting, without necessarily requiring application of an external force. In either case, the process may be applied multiple times to yield a plurality of wafers from a single semiconductor boule.

II. Subcritical Cracks

Figure 11:
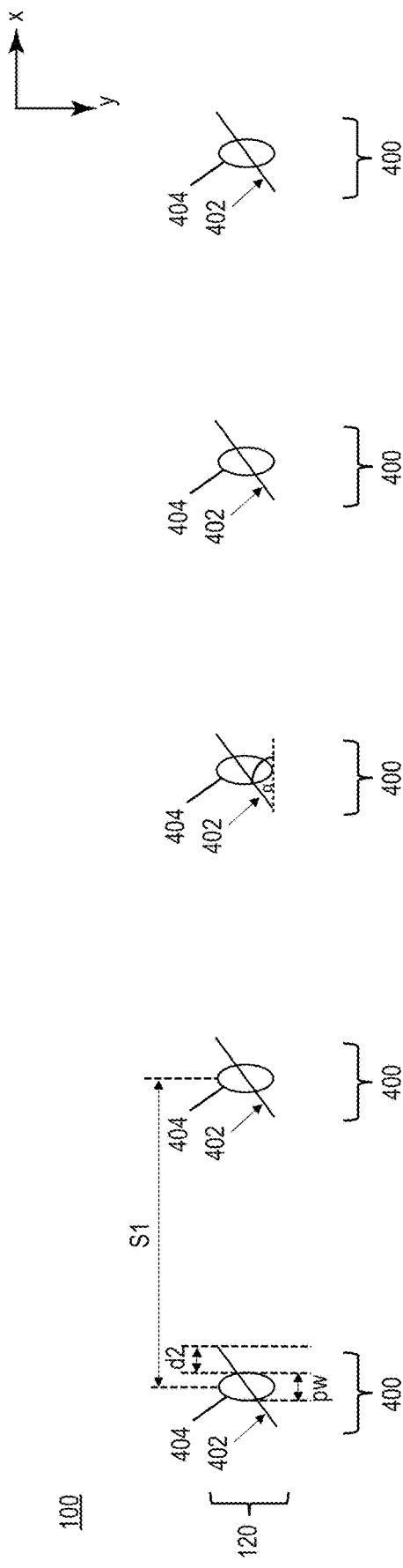
FIG. 11 illustrates an embodiment of a subcritical crack formation process.
Figure 12:
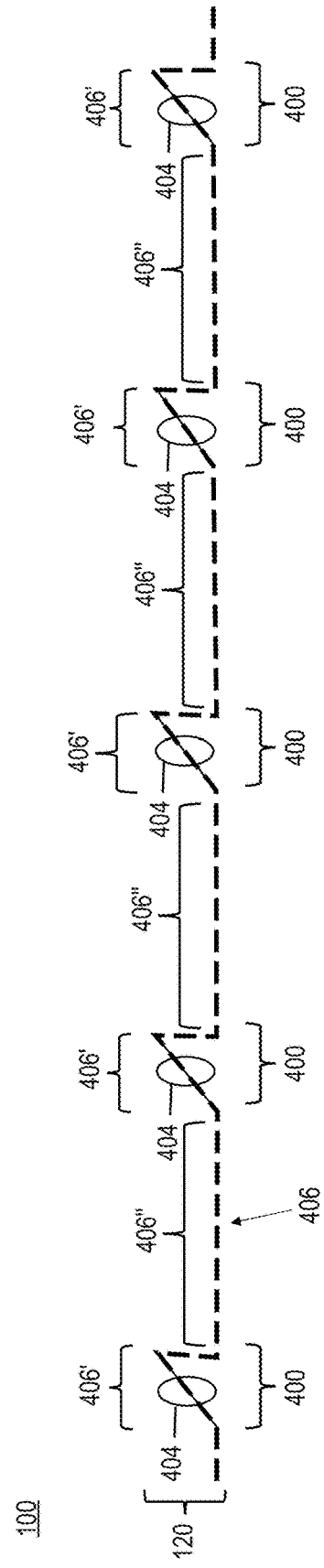
FIG. 12 illustrates at least one master crack formed by that connects the subcritical cracks.

As explained above in connection with the non-ablative multi beam splitting method, a separation zone 120 may be formed within a semiconductor work piece 100 using laser irradiation. FIGS. 11 and 12 illustrate an embodiment according to which pulses of laser light are applied to a first main surface 101 of a monocrystalline semiconductor work piece 100, where the pulses of laser light penetrate the first main surface 101 and form modified regions 400 in the separation zone 120 within the monocrystalline semiconductor work piece 100. Each modified region 400 is delimited by a subcritical crack 402 that surrounds an inner part 404 in which the monocrystallinity of the semiconductor work piece 100 is altered. The pulses of laser light are controlled such that the subcritical cracks 402 of adjacent ones of the modified regions 400 are non-overlapping for at least half of the modified regions 400 formed in the monocrystalline semiconductor work piece 100. In one embodiment, the modified regions 400 are present over at least 50% of the separation zone 120 within the monocrystalline semiconductor work piece 100, e.g., at least 80%, at least 90% or higher. After inducing the subcritical cracks 402, at least one (master or critical) crack 406 is formed within the monocrystalline semiconductor work piece 100 and that connects the subcritical cracks 402 as shown in FIG. 12.

A small focus and high instantaneous intensity of one or more laser beams allows a significant multiphoton component at each focal point within the monocrystalline semiconductor work piece 100. Multiphoton absorption together with charge carriers already present in the semiconductor work piece 100 (e.g., from doping) causes free charge carriers to interact with the laser light. Additional charge carrier generation inside the focal point comes from multiphoton absorption. This leads to a localized avalanche breakdown in the separation zone 120 which manifests itself as a plasma. The localized plasma, which is maintained by the laser pulses, rips surrounding electrons away from atoms of the surrounding crystal. What remains is a modified region 400 of material which has amorphous components (phase change) and polycrystalline components where the ratio of polycrystalline to amorphous components depends on the laser pulse duration.

Stress is relieved along the cracking plane by connecting the subcritical cracks 402 via at least one (master or critical) crack 406, as shown in FIG. 12, and which results in a (splitting) perforation of the entire work piece 100. For SiC, the preferred cracking plane is the c-plane which is oriented at an angle α of 4 degrees. In this case, the subcritical cracks 402 of the modified regions 400 propagate along the c-plane of the SiC monocrystalline body 100, as shown in FIG. 12. The at least one (master or critical) crack 406 may not propagate along the c-plane between adjacent ones of the modified regions 400 to connect the non-overlapping subcritical cracks 402, as shown in FIG. 12 where the at least one (master or critical) crack 406 is illustrated as a dashed line having a sawtooth part 406' that follows the c-plane and a horizontal part 406" between adjacent modified regions 400 that does not follow the c-plane relative to the first main surface 101 of the monocrystalline semiconductor work piece 100. Accordingly, the at least one (master or critical) crack 406 may produce a suitable rough-grind surface quality with a height variation of at most 1 micron RA where RA is the arithmetic average of absolute values of height deviations for the at least one crack 406 from a mean line.

Figure 13:
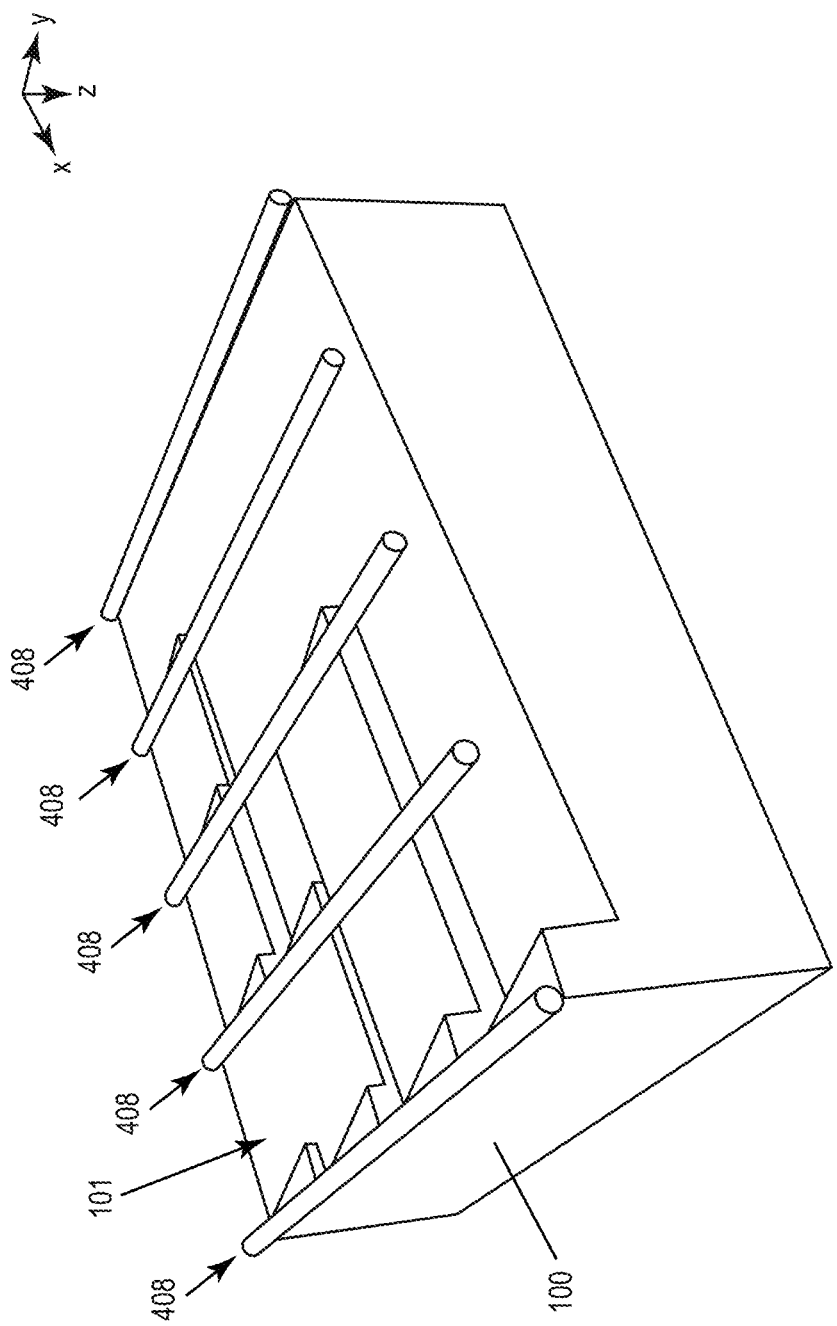
FIG. 13 illustrates an embodiment where the monocrystalline semiconductor work piece is a SiC work piece.
Figure 14:
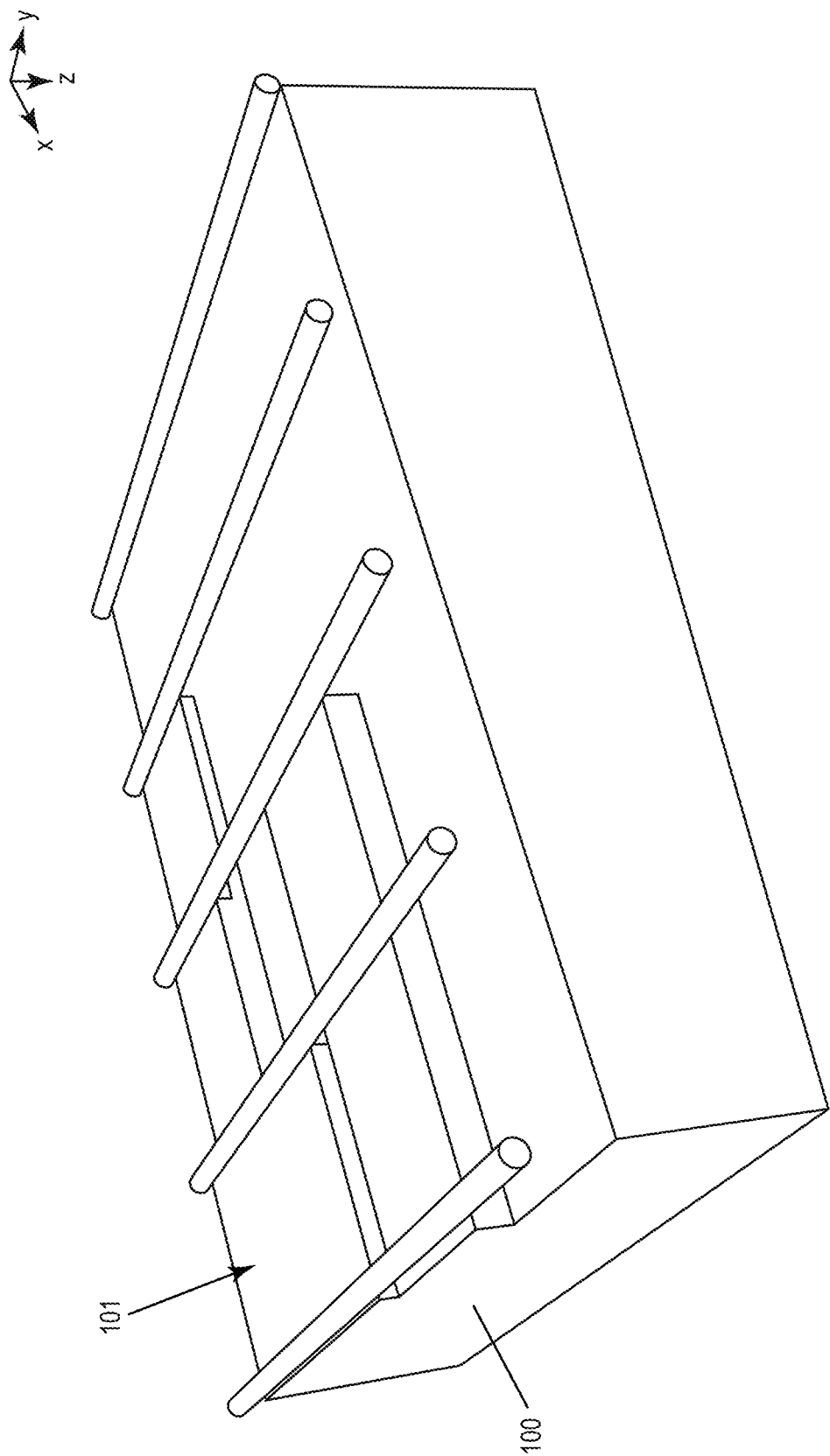
FIG. 14 illustrates an embodiment where the monocrystalline semiconductor work piece has a different orientation than SiC.

FIG. 13 illustrates an embodiment where the monocrystalline semiconductor work piece 100 is a SiC work piece. The 4 degrees c.-plane orientation is shown in the y direction in FIG. 13, as are several rows 408 of laser light pulses applied to the first main surface 101 of the SiC work piece 100 to form the modified regions 400 at different depths (z direction) within the SiC work piece 100. FIG. 14 illustrates an embodiment where the monocrystalline semiconductor work piece 100 has a different crystalline orientation in the y direction.

As illustrated in FIG. 11, the pulses of laser light are controlled such that the microcracks of adjacent modified regions 400 are non-overlapping for at least half of the modified regions 400 formed in the monocrystalline semiconductor work piece 100. Microcracks 402 that do not overlap other microcracks are referred to herein as subcritical cracks. The term 'subcritical crack' as used herein means a microcrack that does not overlap a microcrack that delimits an adjacent modified region 400 in the laser irradiation direction (x direction in FIG. 11). Accordingly, a subcritical crack 402 has a two-dimensional (x and y directions in FIG. 11) linear dimension d2 that is less than or equal to the spacing S1 between adjacent microcracks (i.e., d2≤S1). In one embodiment, d2≤0.5*S1. Such subcritical cracks 402 may be formed using a laser beam waist below 2 microns (μm) with individual laser 'shots' or pulses having a width 'pw' larger than 2 microns.

In general, any of the laser irradiation techniques and apparatuses previously described herein in connection with FIGS. 1A through 10 may be used to produce the subcritical cracks 402 for at least half of the modified regions 400 formed in the monocrystalline semiconductor work piece 100. According to the subcritical crack technique, connecting microcracks during the laser modification process is avoided for at least half of the modified regions 400 formed in the monocrystalline semiconductor work piece 100. For example, the pulses of laser light may be controlled such that subcritical cracks 402 of adjacent modified regions 400 are non-overlapping for at least 90% of the modified regions 400 formed in the monocrystalline semiconductor work piece 100.

An external force or stress may be applied to the semiconductor work piece 100 to split the semiconductor work piece 100 into two separate pieces, e.g., as shown in FIG. 1D. Pressure may be applied to the semiconductor work piece during the splitting of the semiconductor work piece 100 into the two separate pieces. To aid the separation/splitting process, an UV-edge laser or other edge-opening technique may be used to help initiate the at least one (master or critical) crack 406. Separately or in combination, a multi-step process may be employed where laser 'shots' or pulses with different distance, spacing and energy precede or follow a more homogeneous pattern, leading to additional supporting points for a travelling master/critical crack 406 during the separation event. After splitting the semiconductor work piece 100 into two separate pieces, the surface roughness of each separation surface may be reduced as previously described herein.

In one embodiment, an external force or stress is applied to the semiconductor work piece 100 by applying a polymer to the semiconductor work piece 100 or to an intermediate carrier layer on the semiconductor work piece 100. The polymer has a CTE different from the CTE of the semiconductor work piece 100. The polymer and the semiconductor work piece 100 are then subjected to a temperature process during which the polymer imparts mechanical stress to the semiconductor work piece 100.

Figure 15:
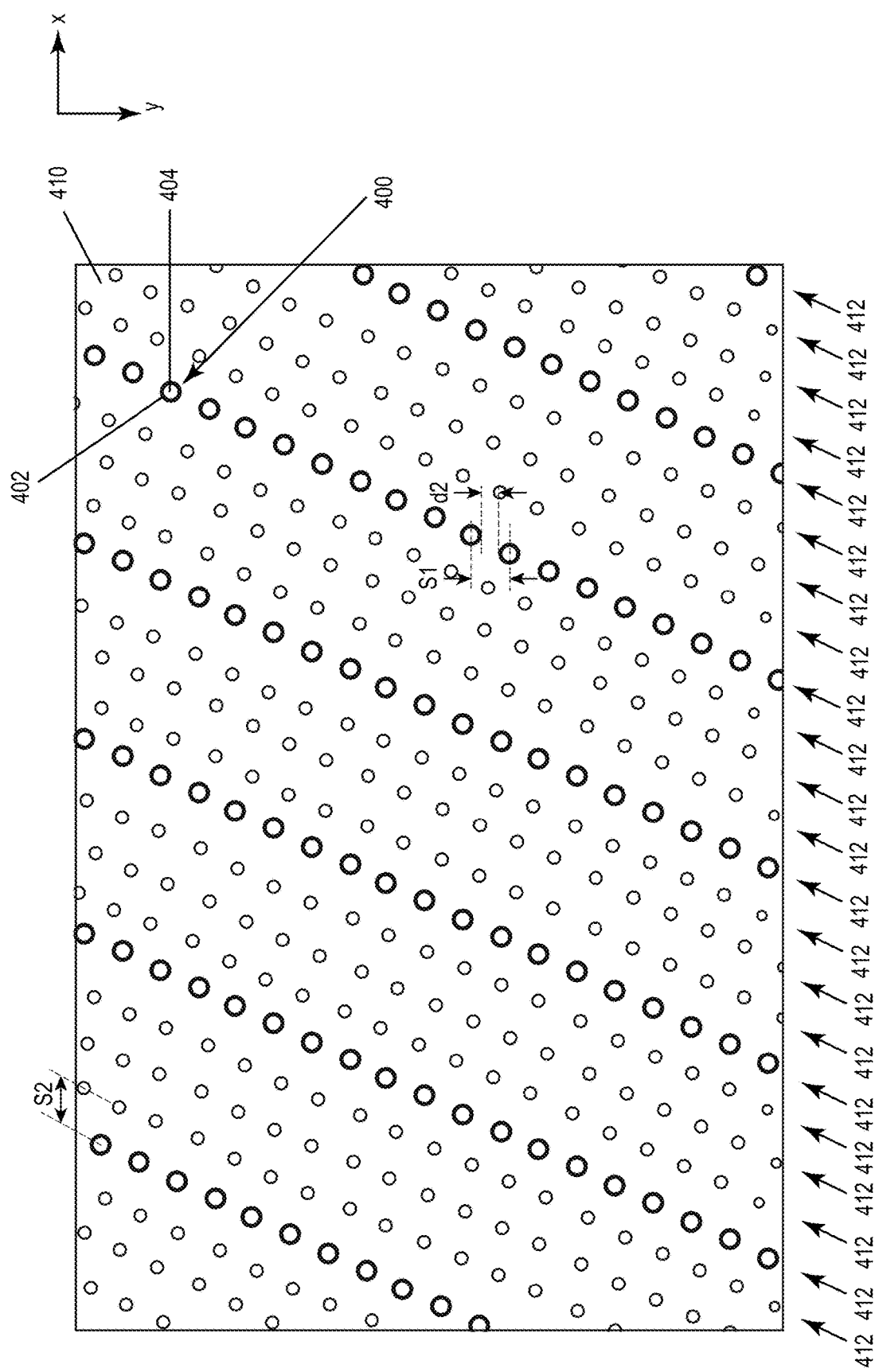
FIG. 15 illustrates an embodiment of adjacent modified regions with non-overlapping subcritical cracks each having a circular or elliptical shape and distributed along rows that are spaced apart from one another.

An external force such as a cryo-temperature polymer contracting acts to generate at least one master/critical crack 406 with minimal vertical extension in the separation plane. Typically, for doped 4H SiC, the crack planes will be inclined with a 4 degree angle to the surface. This defines the local vertical extent of the crack plane as the longest crack times tan 4°. In one embodiment, subcritical cracks 402 are only locally present with significant portions of the material area 410 remaining unmodified and uncracked, e.g., as shown in FIG. 15. For example, more than 30% of the separation zone 120 of the semiconductor work piece 100 may be unmodified by the pulses of laser light and remain monocrystalline. In another example, more than 50% of the separation zone 120 of the semiconductor work piece 100 may be unmodified by the pulses of laser light and remain monocrystalline. The inner part 404 of the modified regions 400 may collectively occupy, e.g., up to 70% of the separation zone 120 of the semiconductor work piece 100.

For single laser 'shots' or pulses, each identifiable pulse produces a visible crack halo 402 that surrounds the inner part 404 of the modified regions 400. An external force may be applied to separate the material along the separation zone 120, however, the 4° inclination in the case of SiC is heavily reduced or even foregone as previously explained herein. This affords a surface roughness of below 1 um after separation, heavily reducing grind effort and costs while at the same possibly allowing to forego a rough-grind step altogether. The rough grinding step of split SiC is especially costly as the sawtooth pattern of the crack plane acts as dressing surface for grinding wheels.

In FIG. 15, adjacent modified regions 400 with non-overlapping subcritical cracks 402 each have a circular or elliptical shape and are distributed along rows 412 that are spaced apart from one another. The spacing at which the pulses of laser light penetrate the first main surface of the semiconductor work piece 100 may be controlled such that each pulse of laser light forms one of the modified regions 400 having a circular or elliptical shape. Circular or elliptical shaped modified regions 400 may be formed by a Gaussian intensity distribution. In general, temporal laser pulse forming from single pulses, bursts and pulse trains may be used to form modified regions 400 having circular, elliptical or even dashed line shapes. For example, both the frequency (i.e., repetition rate) of the pulses of laser light and the speed at which the monocrystalline semiconductor work piece 100 moves relative to the source of the laser light pulses may be controlled such that subcritical cracks 402 are non-overlapping for at least half of the modified regions 400 having a circular, elliptical, or dashed line shape.

The laser light pulse spacing may be controlled such that adjacent modified regions 400 with non-overlapping subcritical cracks 402 are spaced apart from one another by a distance S1 of at most 30 microns where S1 is a center-to-center distance in the case of circular, elliptical, or dashed line shapes or an 'outer ring' distance in the case of circular or elliptical shapes, and is a function of crystal orientation and writing angle. For 0° (90° towards flat), the weakening due to the perforation density should be on the same c-plane for SiC. For other angles (e.g., 15°, 30°, etc.), the workpiece thickness (distance from different c-planes for SiC) should remain rigid enough for not interacting with adjacent damage.

In another example, the laser light pulse spacing may be controlled such that adjacent modified regions 400 with non-overlapping subcritical cracks 402 are spaced apart from one another by a distance S1 of at most 20 microns. In another example, the laser light pulse spacing may be controlled such that adjacent modified regions 400 with non-overlapping subcritical cracks 402 are spaced apart from one another by a distance S1 in a range of 30 microns to 5 microns. In another example, the laser light pulse spacing may be controlled such that adjacent modified regions 400 with non-overlapping subcritical cracks 402 are spaced apart from one another by different distances for different lateral dimensions that run parallel with the first main surface 101 of the monocrystalline semiconductor work piece 100. In FIG. 15, this means that the rows 412 of modified regions 400 may have the same or different spacing S2 in the x direction.

Figure 16:
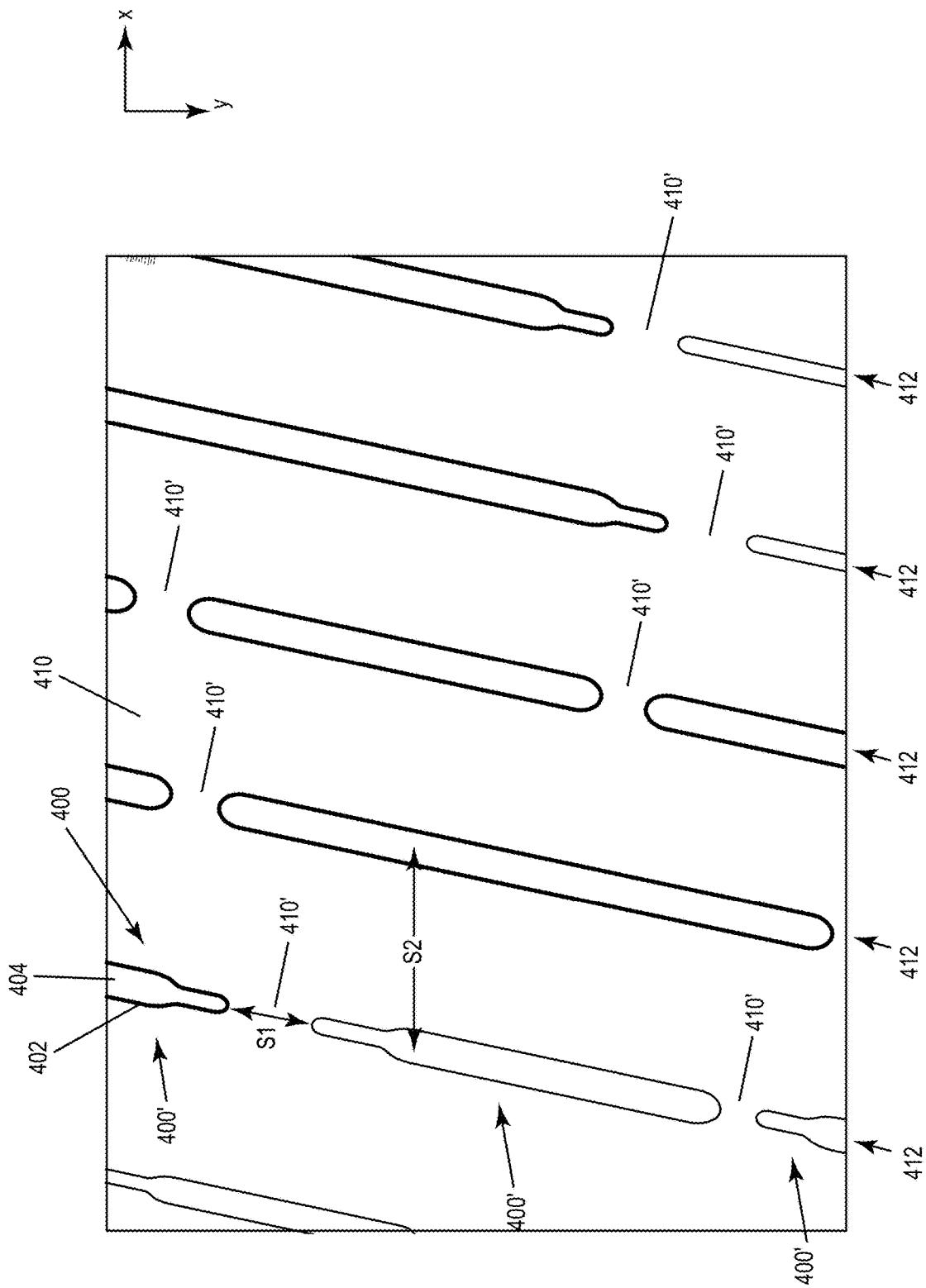
FIG. 16 illustrates an embodiment of the modified regions having a dashed line shape.

FIG. 16 illustrates an embodiment of modified regions 400 having a dashed line shape. According to this embodiment, individual rows 412 of modified regions 400 are segmented such that the modified regions 400 in the same row 412 has subcritical cracks 402 that are separated from one another (i.e., non-overlapping) by a distance S1 over the length (y direction in FIG. 16) of the row 412. That is, the modified regions 400 in the same row 412 and having a linear shape are divided into two of more segments 400' that are separated from one another by a monocrystalline region 410' of the semiconductor work piece 100 that is unmodified by the pulses of laser light.

Subcritical cracks 402 of adjacent rows 412 of linear shaped modified regions 400 are separated from one another by a center-to-center distance S2 in the transverse direction (x direction in FIG. 16) of the rows 412. The intra line subcritical crack spacing S1 may not be uniform over the entire semiconductor work piece 100. Likewise, the inter line subcritical crack spacing S2 may not be uniform over the entire semiconductor work piece 100. The intra line subcritical crack spacing S1 depends on the frequency (i.e., repetition rate) of the laser light pulses whereas the inter line subcritical crack spacing S2 is a function of the positioning of the work piece 100 relative to the laser light source during the laser writing process. Both S1 and S2 have inherent variability. Intentional variability may be added to S1 and/or S2. The pulse duration of the laser light may be in a range of 100 ps to 5 ns, for example. Such relatively short pulse durations, in connection with the non-overlapping subcritical cracks 402, yields a very stable crack extension within the subcritical cracks 402.

In one embodiment, the spacing at which the pulses of laser light penetrate the first main surface 101 of the monocrystalline semiconductor work piece 100 is controlled such that the pulses of the laser light along the same row 412 form one of the modified regions 400 having a linear shape. For example, the laser light pulse spacing may be controlled such that the subcritical cracks 402 of adjacent rows 412 of the modified regions 400 that are non-overlapping are spaced apart from one another by a center-to-center distance S2 of at most 100 microns. In another example, the laser light pulse spacing may be controlled such that the subcritical cracks 402 of adjacent rows 412 of modified regions 400 that are non-overlapping are spaced apart from one another by a center-to-center distance S2 of at most 80 microns. In another example, both the frequency (i.e., repetition rate) of the pulses of laser light and the speed at which the monocrystalline semiconductor work piece 100 moves relative to a source of the pulses of laser light may be controlled such that the subcritical cracks 402 are non-overlapping for at least half of the modified regions 400 having a linear shape.

Figure 17:
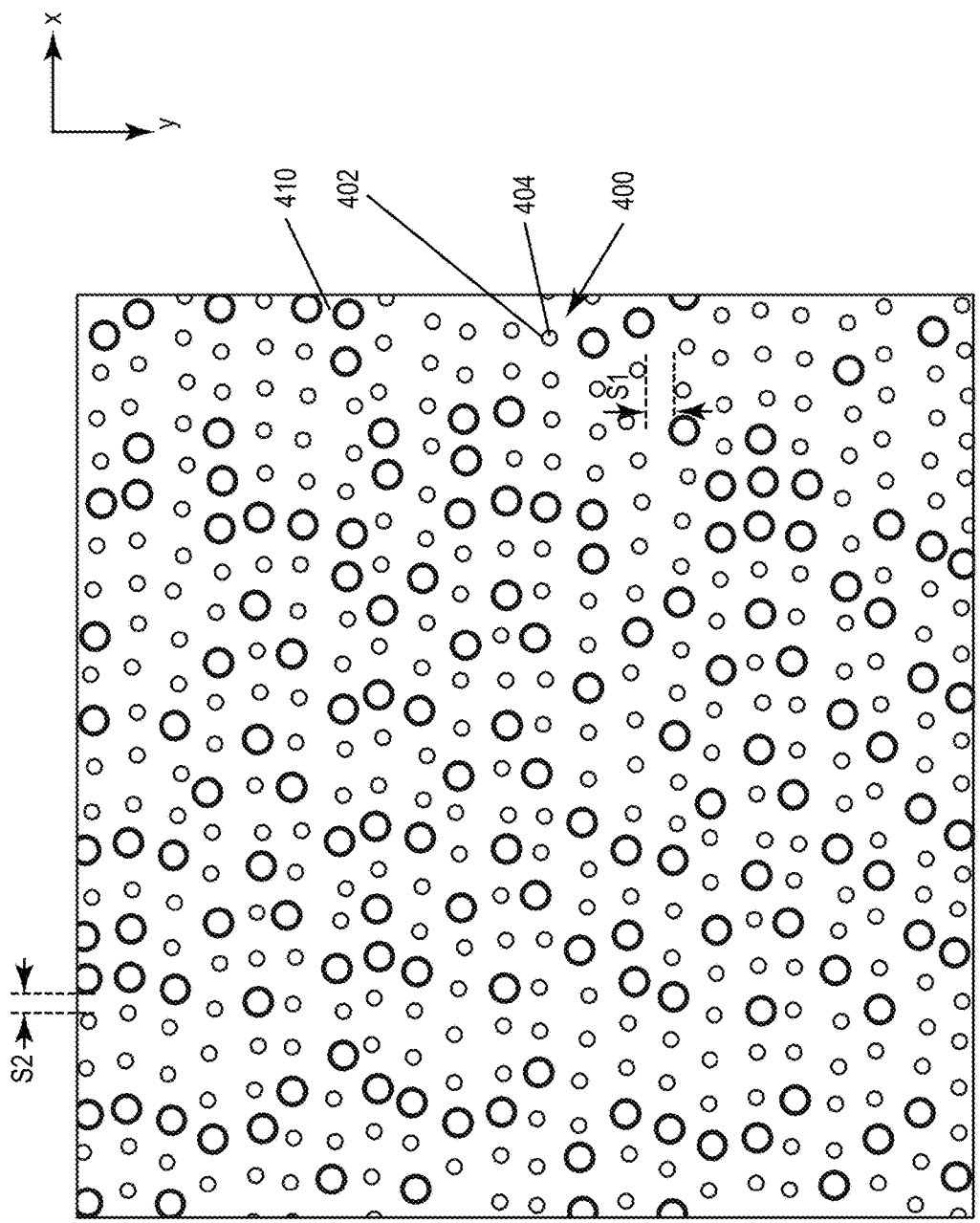
FIG. 17 illustrates an embodiment according to which the spacing of the modified regions with non-overlapping subcritical cracks has a hexagonal pattern over at least part of the monocrystalline semiconductor work piece.

FIG. 17 illustrates an embodiment according to which the spacing of the modified regions 400 with non-overlapping subcritical cracks 402 has a hexagonal pattern over at least part of the monocrystalline semiconductor work piece 100. According to this embodiment, the modified regions 400 with non-overlapping subcritical cracks 402 are positioned at edges of the hexagonal pattern.

As explained above, any of the laser irradiation techniques and apparatuses previously described herein in connection with FIGS. 1A through 10 may be used to produce the subcritical cracks 402 for at least half of the modified regions 400 formed in the monocrystalline semiconductor work piece 100. Accordingly, the pulses of laser light applied to the first main surface 101 of the monocrystalline semiconductor work piece 100 may be generated by focusing at least two laser beams to targeted positions within the separation zone 120. Focusing the at least two laser beams to the targeted positions within the separation zone 120 may include forming two or more coherent parallel laser beams and focusing the two or more coherent laser beams through a condenser optics system such as an f theta lens. The at least two laser beams may have a ring-shaped intensity profile. The at least two laser beams may be operated in a pulsed mode. For example, the pulsed mode may be a single pulse mode or a burst mode with two or more subpulses. In another embodiment, the at least two laser beams may be focussed to the targeted positions within the separation zone by splitting a single laser beam emitted from a laser source into two or more partial laser beams and focusing the two or more partial laser beams through a condenser optics system.

III. Shape Change Compensation

The non-ablative multi beam splitting and subcritical crack techniques described herein use a laser for introducing modifications inside crystalline semiconductor material to create a mechanically weakened predefined layer for later separation/splitting. The non-ablative multi beam splitting process, however, induces stresses also during the laser writing process. As a result, the work piece macroscopically deforms during the writing process, leading to auto-focus inaccuracies and therefore positioning errors of the laser plane within the work piece, especially for wafers. These errors may lead to non-optimal laser plane shape and location and subsequently increased grinding after separation, leading to higher material loss and thinner reclaim wafers. In the extreme, the yield of functional devices and/or viable reclaimed wafers in wafer twinning is reduced by these positioning errors.

The shape change compensation techniques described herein use one or more tooling measures to compensate for work piece deformation that may arise during non-ablative multi beam splitting, as well as laser modification strategies that gradually increase the work piece stress, without high stress gradients, so that the work piece shape does not change or changes minimally, and/or that mounting/clamping forces adapt to the work piece deformation over the course of the non-ablative multi beam splitting process. Other embodiments include deformable chuck clamping, which adapts to the stress, a feedback loop of in-process measurements to correct based on a pre-characterization map (e.g., via distance/thickness sensor monitoring laser plane location). The laser pattern design (e.g., the laser-modified material density distribution) may be designed such that a favorable or less problematic shape-change behavior is achieved. The shape change compensation techniques described herein may be used in combination with one another, and with the non-ablative multi beam splitting and subcritical crack techniques previously described herein.

Figure 18:
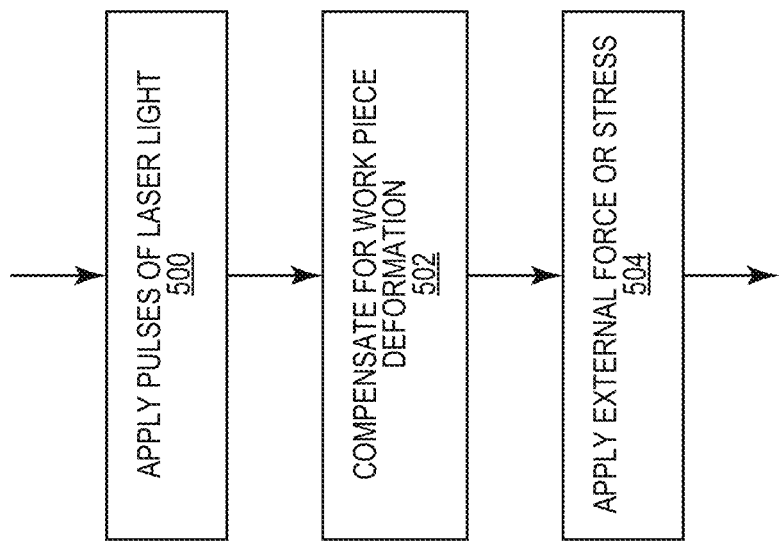
FIG. 18 illustrates an embodiment of a method of splitting a semiconductor work piece and that utilizes shape change compensation.

FIG. 18 illustrates an embodiment of a method of splitting a semiconductor work piece and that utilizes the shape change compensation technique. According to this embodiment, the method includes applying pulses of laser light to a first main surface of a semiconductor work piece (Block 500). The pulses of laser light penetrate the first main surface and form modified regions in a separation zone within the semiconductor work piece, each modified region being delimited by a subcritical crack that surrounds an inner part in which a monocrystallinity of the semiconductor work piece is altered, e.g., as previously described herein in connection with the non-ablative multi beam splitting and/or subcritical crack techniques.

The method further includes compensating for deformation of the semiconductor work piece that arises during application of the pulses of laser light (Block 502). By compensating for the work piece deformation, focal deviation from a target plane within the separation zone is reduced for the pulses of laser light that penetrate the first main surface over the entire semiconductor work piece.

The method also includes applying an external force or stress to the semiconductor work piece (Block 504). By applying the external force or stress, at least one crack propagates along the separation zone and the semiconductor work piece splits into two separate pieces. In one embodiment, the semiconductor work piece has a thickness of 1 mm or less. Separately or in combination, the semiconductor work piece is a semiconductor ingot having a thickness of 500 microns or less. In another embodiment, the semiconductor work piece is a semiconductor wafer having a thickness of 350 microns or less.

Figure 19:
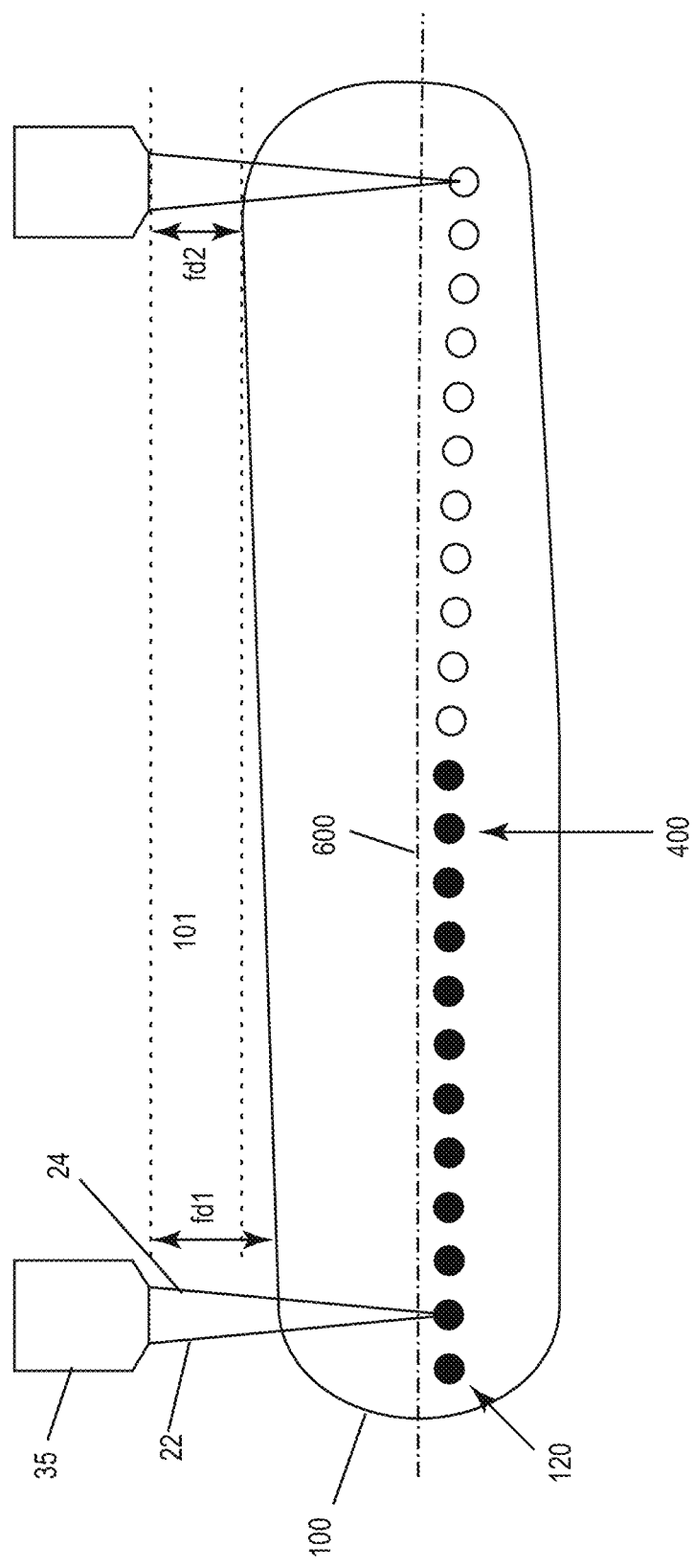
FIG. 19 illustrates an embodiment of the shape change compensation technique.

FIG. 19 illustrates an embodiment of the shape change compensation technique. The laser writing process, which may include focusing at least two laser beams 22, 24 to targeted positions within the separation zone to form the modified regions 400, is tuned to minimize expected/measured work piece deformation from wafer stresses. As shown in FIG. 19, the wafer work piece 100 bows or warps during the laser writing process. If uncompensated, the wafer bow/warpage changes the focal depth range from a first depth fd1 to a second depth fd2.

The laser writing process may be adjusted using a feedback loop based on in-process measurements to account for the work piece deformation, e.g., based on a pre-characterization map (e.g., via distance/thickness sensor monitoring laser plane location). By implementing a laser-modified material density distribution for optimum shape change behavior, a relatively uniform target depth 600 for defining the separation zone 120 of the semiconductor work piece 100 may be achieved over the entire laser writing process. For example, a feedback loop may be implemented in software and that uses measurement data from confocal chromatic thickness sensors to account for the actual work piece deformation. The laser focal depth is adjusted accordingly. If the work piece deformation behavior is known in advance, a compensated autofocus-map may be applied to adopt a writing depth profile that counters or follows the deformation.

An interleaved writing strategy may be used where laser lines are written at double spacing then repeated with equally spaced lines in between to gradually increase stress over the whole work piece 100, while avoiding a large stress at a single point in the work piece 100. An adaptive laser writing strategy may be used, which may be implemented as a mix of first order stress control via an interleaved writing of meandering lines with fixed or variable interspacing and a second order stress control process. For example, laser energy for the second pass of the second interleaved pattern 802 may be adapted, where lower energy is sufficient to generate cracks. Based on determined stress information, a point pattern with controlled density and varying over the whole work piece area (up to fractal) may be devised. A chromatic or other optical thickness sensor may be used in a polarization-filtered configuration to yield local stress field feedback on top of thickness and depth information in-process.

Figure 20:
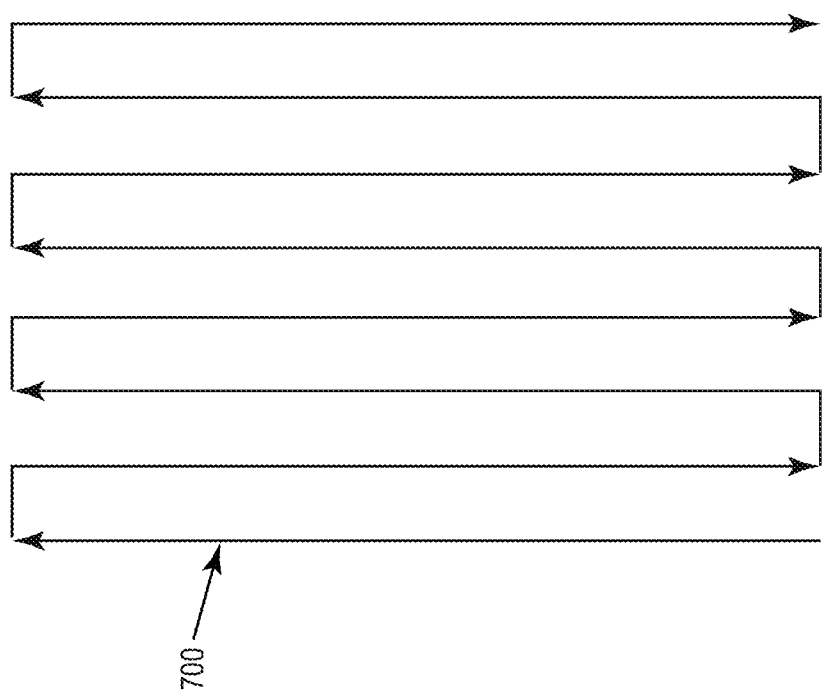
FIG. 20 illustrates another embodiment of the shape change compensation technique.

FIG. 20 illustrates another embodiment of the shape change compensation technique. According to this embodiment, work piece deformation is compensated for by applying pulses of laser light in a meandering pattern 700.

Figure 21:
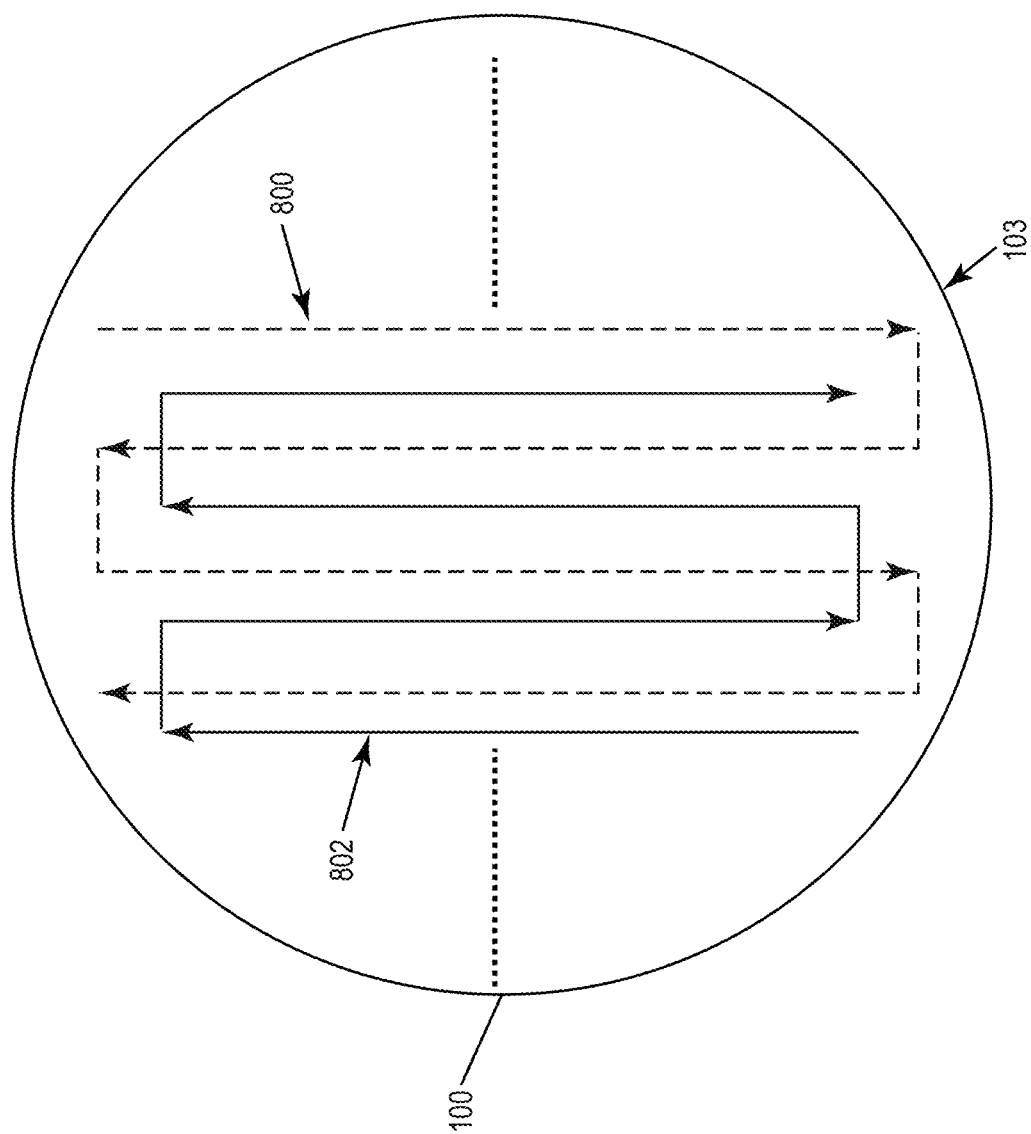
FIG. 21 illustrates another embodiment of the shape change compensation technique.

FIG. 21 illustrates another embodiment of the shape change compensation technique. According to this embodiment, work piece deformation is compensated for by applying pulses of laser light in at least two meandering patterns 800, 802 that are interleaved with one another and intersect one another. A first one 800 of the at least two meandering patterns 800, 802 may run closer to an edge 103 of the semiconductor work piece 100 than a second one 802 of the at least two meandering patterns 800, 802.

Figure 22:
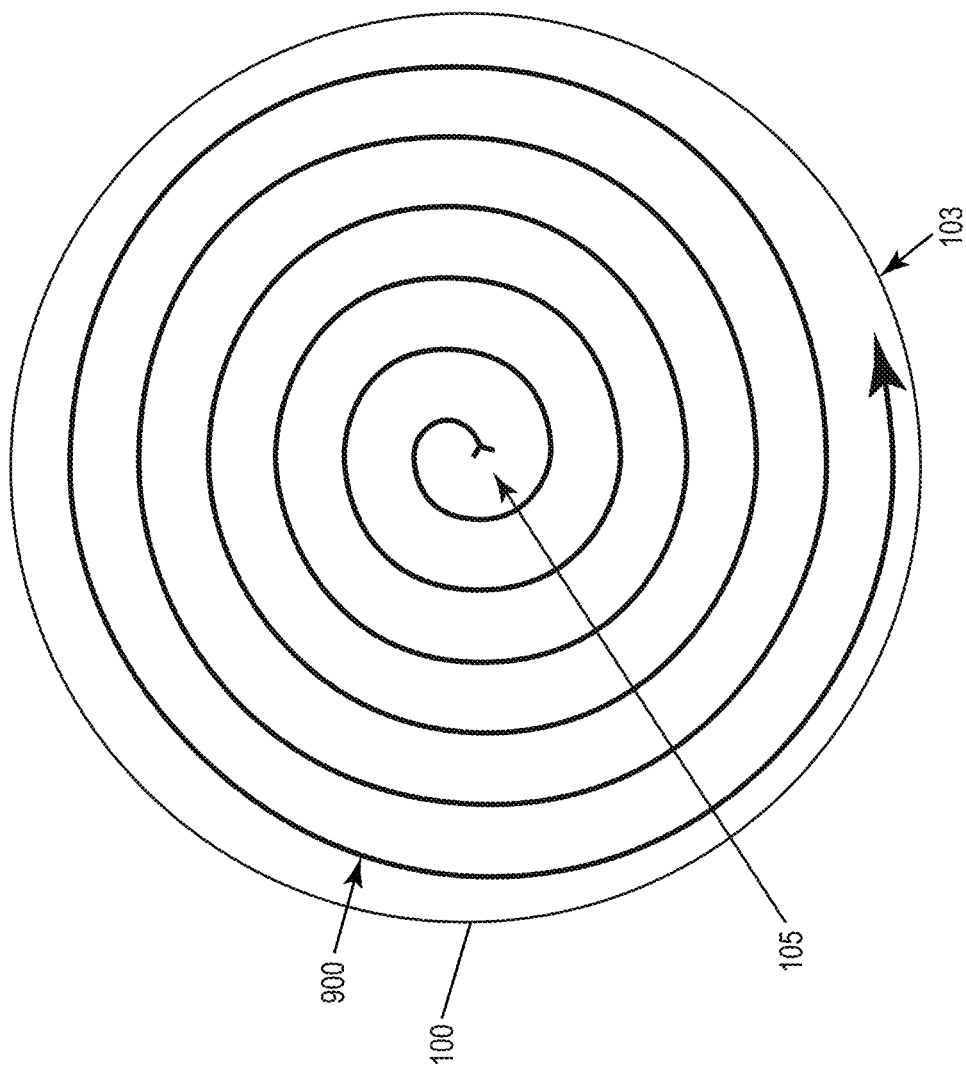
FIG. 22 illustrates another embodiment of the shape change compensation technique.

FIG. 22 illustrates another embodiment of the shape change compensation technique. According to this embodiment, work piece deformation is compensated for by applying pulses of laser light in a spiral pattern 900 that begins at the center 105 of the first main surface 101 of the semiconductor work piece 100 and terminates near the work piece edge 103, as indicated by the arrow beginning and end markings in FIG. 22.

Figure 23:
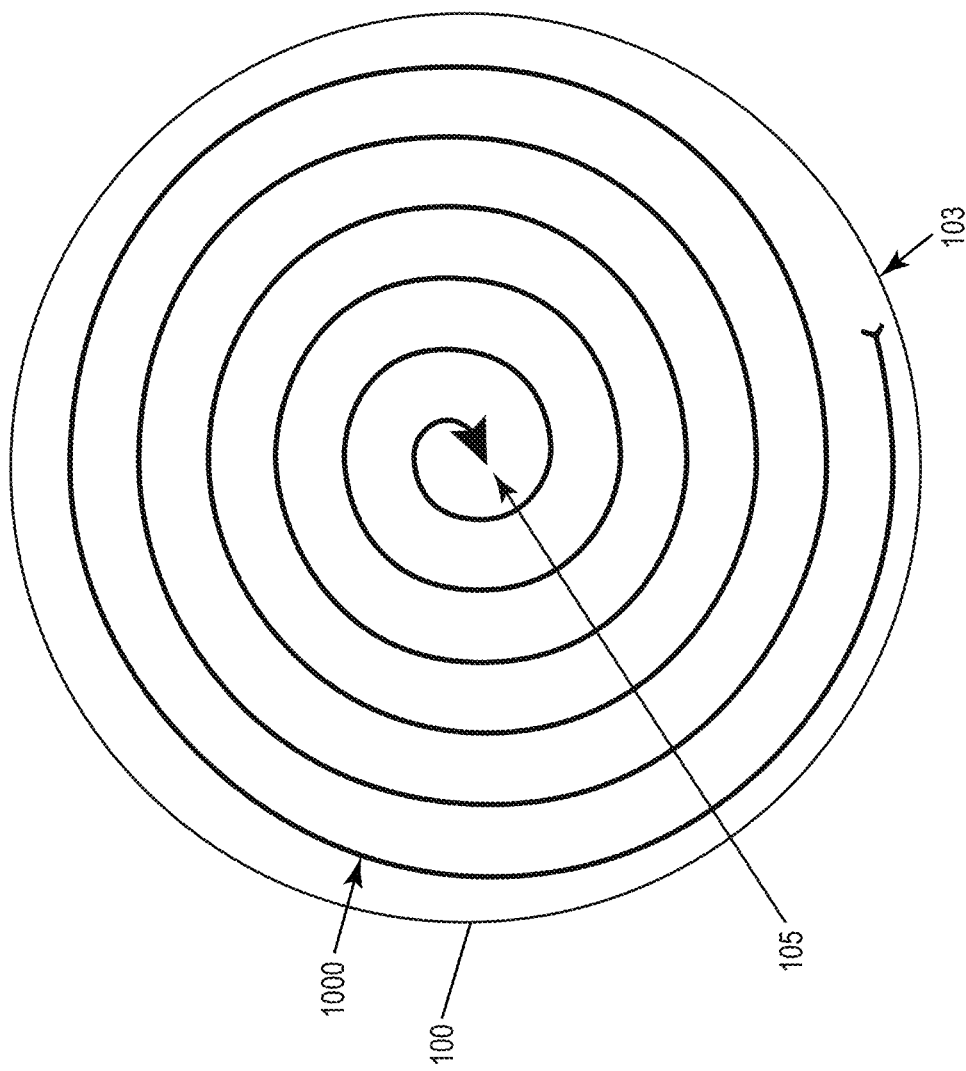
FIG. 23 illustrates another embodiment of the shape change compensation technique.

FIG. 23 illustrates another embodiment of the shape change compensation technique. According to this embodiment, work piece deformation is compensated for by applying pulses of laser light in a spiral pattern 1000 that begins near the edge 103 of the semiconductor work piece 100 and terminates at the center 105 of the first main surface 101 of the work piece 100, as indicated by the arrow beginning and end markings in FIG. 22.

Figure 24:
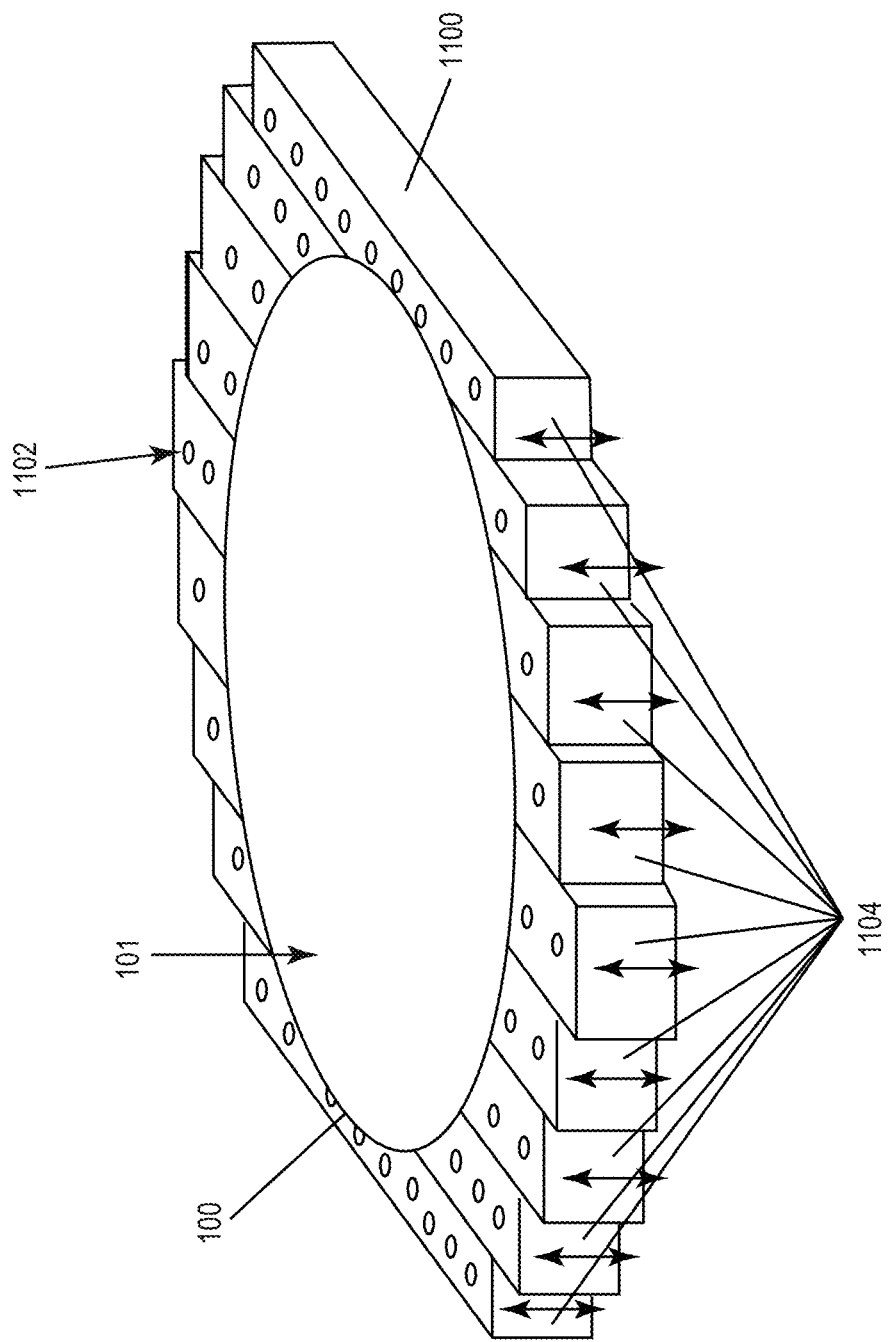
FIG. 24 illustrates another embodiment of the shape change compensation technique.

FIG. 24 illustrates another embodiment of the shape change compensation technique. According to this embodiment, the second main surface (out of view) of the semiconductor work piece 100 is supported by an adaptive chuck 1100 having openings 1102 for applying a vacuum to the work piece 100. The adaptive chuck 1100 also has individually moveable segments 1104. Work piece deformation that arises during application of laser light pulses to the first main surface 101 of the work piece 100 is compensated for by adjusting a vertical position of one or more of the individually moveable segments 1104 of the adaptive chuck 1100 relative to the second main surface of the semiconductor work piece 100, as indicated by the vertical lines in FIG. 24. The vertical position of one or more of the individually moveable segments 1104 of the adaptive chuck 1100 may be adjusted relative to the second main surface of the semiconductor work piece 100 based on a predetermined configuration and/or based on measurement data collected during the laser writing process.

Figure 25:
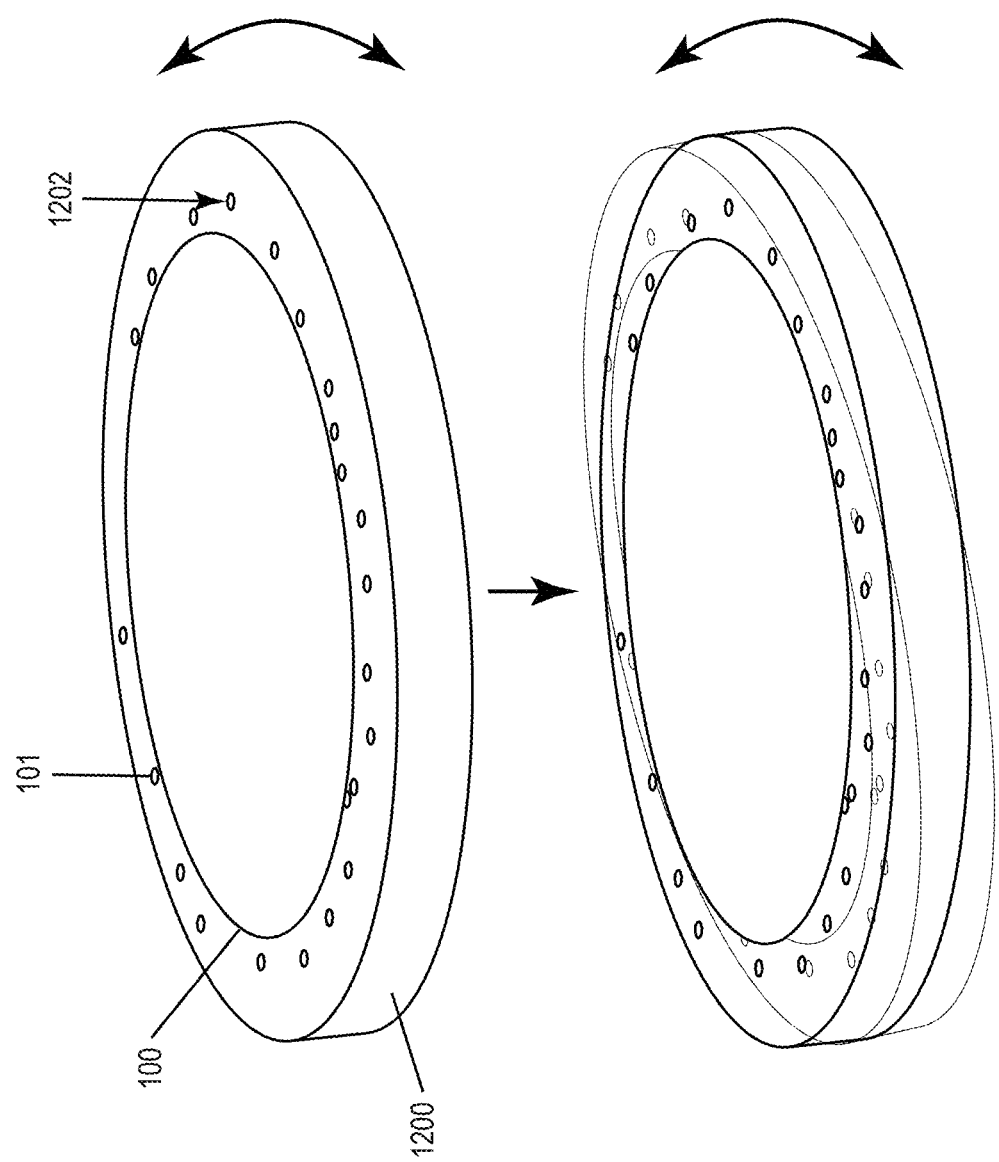
FIG. 25 illustrates another embodiment of the shape change compensation technique.

FIG. 25 illustrates another embodiment of the shape change compensation technique. According to this embodiment, the second main surface (out of view) of the semiconductor work piece 100 is supported by a chuck 1200 having openings 1202 for applying a vacuum to the work piece 100. Work piece deformation that arises during application of pulses of laser light to the first main surface 101 of the work piece 100 is compensated for by tilting the chuck 1200 relative to the second main surface of the semiconductor work piece 100, as indicated by the curved lines in FIG. 25.

Various embodiments of the non-ablative multi beam splitting technique, the subcritical crack technique, and the shape change compensation technique are described herein. Each of these embodiments may be used in conjunction with any of the other embodiments, unless expressly stated otherwise.

Although the present disclosure is not so limited, the following numbered examples demonstrate one or more aspects of the disclosure.

Example 1

A method of processing a monocrystalline semiconductor work piece, the method comprising: applying pulses of laser light to a first main surface of the monocrystalline semiconductor work piece, the pulses of laser light penetrating the first main surface and forming modified regions in a separation zone within the monocrystalline semiconductor work piece, each modified region being delimited by a subcritical crack that surrounds an inner part in which the monocrystallinity of the semiconductor work piece is altered; controlling the pulses of laser light such that the subcritical cracks of adjacent ones of the modified regions are non-overlapping for at least half of the modified regions formed in the monocrystalline semiconductor work piece; and after inducing the subcritical cracks, forming at least one crack that connects the subcritical cracks.

Example 2

The method of example 1, wherein the adjacent ones of the modified regions with non-overlapping subcritical cracks each have a circular or elliptical shape and are distributed along lines that are spaced apart from one another.

Example 3

The method of example 2, wherein controlling the pulses of laser light comprises: controlling a spacing at which the pulses of laser light penetrate the first main surface such that each pulse of laser light forms one of the modified regions having a circular or elliptical shape.

Example 4

The method of example 3, wherein the spacing is controlled such that the adjacent ones of the modified regions with non-overlapping subcritical cracks are spaced apart from one another by a distance of at most 30 microns.

Example 5

The method of example 3, wherein the spacing is controlled such that the adjacent ones of the modified regions with non-overlapping subcritical cracks are spaced apart from one another by a distance of at most 20 microns.

Example 6

The method of any of examples 3 through 5, wherein the spacing is controlled such that the adjacent ones of the modified regions with non-overlapping subcritical cracks are spaced apart from one another by a distance in a range of 30 microns to 5 microns.

Example 7

The method of any of examples 3 through 6, wherein the spacing is controlled such that the adjacent ones of the modified regions with non-overlapping subcritical cracks are spaced apart from one another by different distances for different lateral dimensions that run parallel with the first main surface of the monocrystalline semiconductor work piece.

Example 8

The method of any of examples 3 through 7, wherein the spacing has a hexagonal pattern over at least part of the monocrystalline semiconductor work piece such that the modified regions with non-overlapping subcritical cracks are positioned at edges of the hexagonal pattern.

Example 9

The method of any of examples 3 through 8, wherein controlling the spacing at which the pulses of laser light penetrate the first main surface comprises: controlling a frequency of the pulses of laser light and a speed at which the monocrystalline semiconductor work piece moves relative to a source of the pulses of laser light such that the subcritical cracks are non-overlapping for at least half of the modified regions having a circular or elliptical shape.

Example 10

The method of any of examples 2 through 9, wherein the adjacent ones of the modified regions with non-overlapping subcritical cracks have a linear dimension measured parallel to the first main surface of the monocrystalline semiconductor work piece and that is at most ½ the distance between the adjacent ones of the modified regions with non-overlapping subcritical cracks.

Example 11

The method of example 1, wherein each one of the modified regions has a linear shape, and wherein the modified regions are distributed along lines that are spaced apart from one another.

Example 12

The method of example 11, wherein controlling the pulses of laser light comprises: controlling a spacing at which the pulses of laser light penetrate the first main surface such that the pulses of the laser light penetrating the first main surface of the monocrystalline semiconductor work piece along the same line form one of the modified regions having a linear shape.

Example 13

The method of example 12, wherein the spacing is controlled such that the subcritical cracks of adjacent ones of the rows of the modified regions that are non-overlapping are spaced apart from one another by a distance of at most 100 microns.

Example 14

The method of example 12, wherein the spacing is controlled such that the subcritical cracks of adjacent ones of the rows of the modified regions that are non-overlapping are spaced apart from one another by a distance of at most 80 microns.

Example 15

The method of any of examples 12 through 14, wherein controlling the spacing at which the pulses of laser light penetrate the first main surface comprises: controlling a frequency of the pulses of laser light and a speed at which the monocrystalline semiconductor work piece moves relative to a source of the pulses of laser light such that the subcritical cracks are non-overlapping for at least half of the modified regions having a linear shape.

Example 16

The method of any of examples 11 through 15, wherein at least some of the modified regions having a linear shape are divided into two of more segments that are separated from one another by a monocrystalline region of the semiconductor work piece that is unmodified by the pulses of laser light.

Example 17

The method of any of examples 1 through 16, wherein the pulses of laser light are controlled such that the subcritical cracks of adjacent ones of the modified regions are non-overlapping for at least 90% of the modified regions formed in the monocrystalline semiconductor work piece.

Example 18

The method of any of examples 1 through 17, wherein the monocrystalline semiconductor work piece is a SiC monocrystalline body, wherein the subcritical cracks of the modified regions propagate along a c-plane of the SiC monocrystalline body, and wherein the at least one crack does not propagate along the c-plane between adjacent ones of the modified regions to connect the non-overlapping subcritical cracks.

Example 19

The method of any of examples 1 through 18, wherein relative to the first main surface of the monocrystalline semiconductor work piece, the at least one crack has a different inclination than the subcritical cracks of adjacent ones of the modified regions that are non-overlapping.

Example 20

The method of any of examples 1 through 19, wherein the at least one crack has a height variation of at most 1 micron RA where RA is the arithmetic average of absolute values of height deviations for the at least one crack from a mean line.

Example 21

The method of any of examples 1 through 20, further comprising: splitting the monocrystalline semiconductor work piece along the at least one crack.

Example 22

The method of any of examples 1 through 21, wherein the monocrystalline semiconductor work piece is a semiconductor wafer.

Example 23

The method of any of examples 1 through 21, wherein the monocrystalline semiconductor work piece is a semiconductor ingot.

Example 24

The method of any of examples 1 through 24, wherein more than 30% of the separation zone is unmodified by the pulses of laser light and remains monocrystalline.

Example 25

The method of any of examples 1 through 24, wherein more than 50% of the separation zone is unmodified by the pulses of laser light and remains monocrystalline.

Example 26

The method of any of examples 1 through 25, wherein applying the pulses of laser light to the first main surface of the monocrystalline semiconductor work piece comprises: focusing at least two laser beams to targeted positions within the separation zone.

Example 27

The method of example 26, wherein focusing the at least two laser beams to the targeted positions within the separation zone comprises: forming two or more coherent parallel laser beams; and focusing the two or more coherent laser beams through a condenser optics system.

Example 28

The method of example 26, wherein focusing the at least two laser beams to the targeted positions within the separation zone comprises: splitting a single laser beam emitted from a laser source into two or more partial laser beams; and focusing the two or more partial laser beams through a condenser optics system.

Example 29

The method of any of examples 26 through 28, wherein the at least two laser beams comprise a ring-shaped intensity profile.

Example 30

The method of any of examples 26 through 29, wherein the at least two laser beams are operated in a pulsed mode.

Example 31

The method of example 30, wherein the pulsed mode is a single pulse mode or a burst mode with two or more subpulses.

Example 32

The method of any of examples 26 through 21, further comprising: compensating for deformation of the monocrystalline semiconductor work piece that arises during application of the pulses of laser light, such that focus deviation from a target plane within the separation zone is reduced for the pulses of laser light that penetrate the first main surface.

Example 33

The method of any of examples 1 through 32, further comprising: compensating for deformation of the monocrystalline semiconductor work piece that arises during application of the pulses of laser light, such that focus deviation from a target plane within the separation zone is reduced for the pulses of laser light that penetrate the first main surface.

Example 34

The method of example 33, wherein the monocrystalline semiconductor work piece has a thickness of 1 mm or less.

Example 35

The method of example 34, wherein the monocrystalline semiconductor work piece is a semiconductor boule having a thickness of 500 microns or less.

Example 36

The method of example 34, wherein the monocrystalline semiconductor work piece is a semiconductor wafer having a thickness of 350 microns or less.'

Example 37

The method of any of examples 33 through 36, wherein compensating for deformation of the monocrystalline semiconductor work piece that arises during application of the pulses of laser light comprises: applying the pulses of laser light in a meandering pattern.

Example 38

The method of any of examples 33 through 37, wherein compensating for deformation of the monocrystalline semiconductor work piece that arises during application of the pulses of laser light comprises: applying the pulses of laser light in at least two meandering patterns that are interleaved with one another and intersect one another.

Example 39

The method of example 38, wherein a first one of the at least two meandering patterns runs closer to an edge of the monocrystalline semiconductor work piece than a second one of the at least two meandering patterns.

Example 40

The method of any of examples 33 through 36, wherein compensating for deformation of the monocrystalline semiconductor work piece that arises during application of the pulses of laser light comprises: applying the pulses of laser light in a spiral pattern that begins near an edge of the monocrystalline semiconductor work piece and terminates at a center of the first main surface.

Example 41

The method of example 33, wherein compensating for deformation of the monocrystalline semiconductor work piece that arises during application of the pulses of laser light comprises: applying the pulses of laser light in a spiral pattern that begins at a center of the first main surface and terminates near an edge of the monocrystalline semiconductor work piece.

Example 42

The method of any of examples 33 through 41, wherein a second main surface of the monocrystalline semiconductor work piece is supported by an adaptive chuck having a plurality of individually moveable segments, and wherein compensating for deformation of the monocrystalline semiconductor work piece that arises during application of the pulses of laser light comprises: during application of the pulses of laser light, adjusting a vertical position of one or more of the individually moveable segments of the adaptive chuck relative to the second main surface of the monocrystalline semiconductor work piece.

Example 43

The method of example 42, wherein the vertical position of one or more of the individually moveable segments of the adaptive chuck is adjusted relative to the second main surface of the monocrystalline semiconductor work piece based on a predetermined configuration.

Example 44

The method of any of examples 33 through 43, wherein a second main surface of the monocrystalline semiconductor work piece is supported by a chuck, and wherein compensating for deformation of the monocrystalline semiconductor work piece that arises during application of the pulses of laser light comprises: during application of the pulses of laser light, tilting the chuck relative to the second main surface of the monocrystalline semiconductor work piece.

Example 45

A method of splitting a semiconductor work piece, the method comprising: forming a separation zone within the semiconductor work piece, wherein forming the separation zone comprises modifying semiconductor material of the semiconductor work piece at a plurality of targeted positions within the separation zone in at least one physical property which increases thermo-mechanical stress within the separation zone relative to a remainder of the semiconductor work piece, wherein modifying the semiconductor material in one of the targeted positions comprises focusing at least two laser beams to the targeted position; and applying an external force or stress to the semiconductor work piece such that at least one crack propagates along the separation zone and the semiconductor work piece splits into two separate pieces.

Example 46

The method of example 45, wherein modifying the semiconductor material in one of the targeted positions comprises: damaging the semiconductor material by creating a plasma in the semiconductor material at the targeted position.

Example 47

The method of example 45, wherein modifying the semiconductor material in one of the targeted positions comprises: damaging the semiconductor material by creating an amorphous material or polycrystalline material or cavities at the targeted position.

Example 48

The method of any of examples 45 through 47, wherein focusing at least two laser beams to the targeted position comprises: forming two or more coherent parallel laser beams; and focusing the two or more coherent laser beams through a condenser optics system.

Example 49

The method of any of examples 45 through 47, wherein focusing at least two laser beams to the targeted position comprises: splitting a single laser beam emitted from a laser source into two or more partial laser beams; and focusing the two or more partial laser beams through a condenser optics system.

Example 50

The method of any of examples 45 through 49, wherein the at least two laser beams focused to the targeted position comprise a ring-shaped intensity profile.

Example 51

The method of any of examples 45 through 50, wherein the at least two laser beams focused to the targeted position are operated in a pulsed mode.

Example 52

The method of example 51, wherein the pulsed mode is a single pulse mode or a burst mode with two or more subpulses.

Example 53

The method of any of examples 45 through 52, wherein the semiconductor work piece is a semiconductor wafer, the method further comprising: before forming the separation zone within the semiconductor wafer, forming one or more epitaxial layers on a front side of the semiconductor wafer, forming a plurality of device structures in the one or more epitaxial layers, and forming a metallization layer and/or a passivation layer over the plurality of device structures.

Example 54

The method of example 53, further comprising: before forming the separation zone within the semiconductor wafer, attaching a carrier to the semiconductor wafer with the one or more epitaxial layers, the carrier protecting the plurality of device structures and mechanically stabilizing the semiconductor wafer.

Example 55

The method of example 53 or 54, wherein the focusing of the at least two laser beams to each of the targeted positions is performed from a side of the semiconductor wafer opposite to the epitaxial layers and the metallization layer and/or passivation layer.

Example 56

The method of any of examples 45 through 55, wherein applying the external force or stress to the semiconductor work piece comprises: applying ultrasonic vibrations to the semiconductor work piece.

Example 57

The method of any of examples 45 through 56, wherein applying the external force or stress to the semiconductor work piece comprises: applying pressure to the semiconductor work piece during splitting of the semiconductor work piece into the two separate pieces.

Example 58

The method of any of examples 45 through 57, wherein applying the external force or stress to the semiconductor work piece comprises: applying a polymer to the semiconductor work piece or to an intermediate carrier layer on the semiconductor work piece, the polymer having a coefficient of thermal expansion different from a coefficient of thermal expansion of the semiconductor work piece; and subjecting the polymer and the semiconductor work piece to a temperature process during which the polymer imparts mechanical stress to the semiconductor work piece.

Example 59

The method of any of examples 45 through 58, further comprising: after the semiconductor work piece is split into the two separate pieces, reducing a surface roughness of a separation surface of both of the two separate pieces, each separation surface being a surface formed as the at least one crack propagates along the separation zone.

Example 60

The method of any of examples 45 through 59, wherein the semiconductor work piece is a SiC wafer or a SiC boule, and wherein the at least one crack formed by applying an external force or stress to the semiconductor work piece has a sawtooth pattern.

Example 61

The method of any of examples 45 through 59, wherein the semiconductor work piece is a semiconductor wafer comprising one or more epitaxial layers at a front side of the semiconductor wafer, wherein a plurality of device structures are in the one or more epitaxial layers, wherein a metallization layer and/or a passivation layer is over the plurality of device structures, wherein focusing the at least two laser beams to each of the targeted positions in the separation zone does not substantially damage a surface of a rear side of the semiconductor wafer or the front side of the semiconductor wafer comprising the one or more epitaxial layers.

Example 62

A semiconductor work piece, comprising: a separation zone having a plurality of targeted positions with at least one modified physical property of a semiconductor material of the semiconductor work piece defining a modification zone bidirectionally extending substantially parallel to a surface of the semiconductor work piece, wherein the modification zone has a thickness in an axis perpendicular to the bidirectional extension of the modification zone of less than 30 µm.

Example 63

A semiconductor wafer, comprising: one or more epitaxial layers at a front side of the semiconductor wafer, the one or more epitaxial layers having a plurality of device structures; and a metallization layer and/or a passivation layer over the plurality of device structures, wherein a surface of the one or more epitaxial layers on the semiconductor wafer is substantially free of stray light defects.

Example 64

An apparatus for defining a separation zone within a semiconductor work piece, the apparatus comprising: at least one means for focusing at least two laser beams to a targeted position within the separation zone; and means for moving the at least two laser beams such that a semiconductor material of the semiconductor work piece can be modified at a plurality of targeted positions within the separation zone in at least one physical property.

Example 65

The apparatus of example 64, further comprising: a laser source; and means for splitting a single laser beam emitted from the laser source into two or more partial laser beams to be focused to the targeted position within the separation zone.

Example 66

A method of splitting a semiconductor work piece, the method comprising: applying pulses of laser light to a first main surface of the semiconductor work piece, the pulses of laser light penetrating the first main surface and forming modified regions in a separation zone within the semiconductor work piece, each modified region being delimited by a subcritical crack that surrounds an inner part in which a monocrystallinity of the semiconductor work piece is altered; compensating for deformation of the semiconductor work piece that arises during application of the pulses of laser light, such that focus deviation from a target plane within the separation zone is reduced for the pulses of laser light that penetrate the first main surface; and applying an external force or stress to the semiconductor work piece such that at least one crack propagates along the separation zone and the semiconductor work piece splits into two separate pieces.

Example 67

The method of example 66, wherein the semiconductor work piece has a thickness of 1 mm or less.

Example 68

The method of example 67, wherein the semiconductor work piece is a semiconductor ingot having a thickness of 500 microns or less.

Example 69

The method of example 67, wherein the semiconductor work piece is a semiconductor wafer having a thickness of 350 microns or less.

Example 70

The method of any of examples 66 through 69, wherein compensating for deformation of the semiconductor work piece that arises during application of the pulses of laser light comprises: applying the pulses of laser light in a meandering pattern.

Example 71

The method of any of examples 66 through 70, wherein compensating for deformation of the semiconductor work piece that arises during application of the pulses of laser light comprises: applying the pulses of laser light in at least two meandering patterns that are interleaved with one another and intersect one another.

Example 72

The method of example 71, wherein a first one of the at least two meandering patterns runs closer to an edge of the semiconductor work piece than a second one of the at least two meandering patterns.

Example 73

The method of any of examples 66 through 72, wherein compensating for deformation of the semiconductor work piece that arises during application of the pulses of laser light comprises: applying the pulses of laser light in a spiral pattern that begins near an edge of the semiconductor work piece and terminates at a center of the first main surface.

Example 74

The method of any of examples 66 through 72, wherein compensating for deformation of the semiconductor work piece that arises during application of the pulses of laser light comprises: applying the pulses of laser light in a spiral pattern that begins at a center of the first main surface and terminates near an edge of the semiconductor work piece.

Example 75

The method of any of examples 66 through 74, wherein a second main surface of the semiconductor work piece is supported by an adaptive chuck having a plurality of individually moveable segments, and wherein compensating for deformation of the semiconductor work piece that arises during application of the pulses of laser light comprises:

during application of the pulses of laser light, adjusting a vertical position of one or more of the individually moveable segments of the adaptive chuck relative to the second main surface of the semiconductor work piece.

Example 76

The method of example 75, wherein the vertical position of one or more of the individually moveable segments of the adaptive chuck is adjusted relative to the second main surface of the semiconductor work piece based on a predetermined configuration.

Example 77

The method of any of examples 66 through 76, wherein a second main surface of the semiconductor work piece is supported by a chuck, and wherein compensating for deformation of the semiconductor work piece that arises during application of the pulses of laser light comprises: during application of the pulses of laser light, tilting the chuck relative to the second main surface of the semiconductor work piece.

Example 78

The method of any of examples 66 through 77, wherein applying the pulses of laser light to the first main surface of the semiconductor work piece comprises: focusing at least two laser beams to targeted positions within the separation zone.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of splitting a semiconductor work piece, the method comprising:
forming a separation zone within the semiconductor work piece, wherein forming the separation zone comprises modifying semiconductor material of the semiconductor work piece at a plurality of targeted positions within the separation zone in at least one physical property which increases thermo-mechanical stress within the separation zone relative to a remainder of the semiconductor work piece, wherein modifying the semiconductor material in one of the targeted positions comprises focusing at least two laser beams to the targeted position; and
applying an external force or stress to the semiconductor work piece such that at least one crack propagates along the separation zone and the semiconductor work piece splits into two separate pieces.

2. The method of claim 1, wherein modifying the semiconductor material in one of the targeted positions comprises:
damaging the semiconductor material by creating a plasma in the semiconductor material at the targeted position.

3. The method of claim 1, wherein modifying the semiconductor material in one of the targeted positions comprises:
damaging the semiconductor material by creating an amorphous material or polycrystalline material or cavities at the targeted position.

4. The method of claim 1, wherein focusing at least two laser beams to the targeted position comprises:
forming two or more coherent parallel laser beams; and
focusing the two or more coherent laser beams through a condenser optics system.

5. The method of claim 1, wherein focusing at least two laser beams to the targeted position comprises:
splitting a single laser beam emitted from a laser source into two or more partial laser beams; and
focusing the two or more partial laser beams through a condenser optics system.

6. The method of claim 1, wherein the at least two laser beams focused to the targeted position comprise a ring-shaped intensity profile.

7. The method of claim 1, wherein the at least two laser beams focused to the targeted position are operated in a pulsed mode.

8. The method of claim 7, wherein the pulsed mode is a single pulse mode or a burst mode with two or more subpulses.

9. The method of claim 1, wherein the semiconductor work piece is a semiconductor wafer, the method further comprising:
before forming the separation zone within the semiconductor wafer, forming one or more epitaxial layers on a front side of the semiconductor wafer, forming a plurality of device structures in the one or more epitaxial layers, and
forming a metallization layer and/or a passivation layer over the plurality of device structures.

10. The method of claim 9, further comprising:
before forming the separation zone within the semiconductor wafer, attaching a carrier to the semiconductor wafer with the one or more epitaxial layers, the carrier protecting the plurality of device structures and mechanically stabilizing the semiconductor wafer.

11. The method of claim 9, wherein the focusing of the at least two laser beams to each of the targeted positions is performed from a side of the semiconductor wafer opposite to the epitaxial layers and the metallization layer and/or passivation layer.

12. The method of claim 1, wherein applying the external force or stress to the semiconductor work piece comprises:
applying ultrasonic vibrations to the semiconductor work piece.

13. The method of claim 1, wherein applying the external force or stress to the semiconductor work piece comprises:
applying pressure to the semiconductor work piece during splitting of the semiconductor work piece into the two separate pieces.

14. The method of claim 1, wherein applying the external force or stress to the semiconductor work piece comprises:
applying a polymer to the semiconductor work piece or to an intermediate carrier layer on the semiconductor work piece, the polymer having a coefficient of thermal expansion different from a coefficient of thermal expansion of the semiconductor work piece; and
subjecting the polymer and the semiconductor work piece to a temperature process during which the polymer imparts mechanical stress to the semiconductor work piece.

15. The method of claim 1, further comprising:
after the semiconductor work piece is split into the two separate pieces, reducing a surface roughness of a separation surface of both of the two separate pieces, each separation surface being a surface formed as the at least one crack propagates along the separation zone.

16. The method of claim 1, wherein the semiconductor work piece is a SiC wafer or a SiC boule, and wherein the at least one crack formed by applying an external force or stress to the semiconductor work piece has a saw-tooth pattern.

17. The method of claim 1, wherein the semiconductor work piece is a semiconductor wafer comprising one or more epitaxial layers at a front side of the semiconductor wafer, wherein a plurality of device structures are in the one or more epitaxial layers, wherein a metallization layer and/or a passivation layer is over the plurality of device structures, wherein focusing the at least two laser beams to each of the targeted positions in the separation zone does not substantially damage a surface of a rear side of the semiconductor wafer or the front side of the semiconductor wafer comprising the one or more epitaxial layers.

18. The method of claim 1, wherein the semiconductor work piece splits into the two separate pieces between a first main surface and a second main surface of the semiconductor work piece.

19. The method of claim 1, wherein the semiconductor work piece is a SiC monocrystalline body, and wherein the SiC monocrystalline body splits into the two separate pieces along a c-plane of the SiC monocrystalline body.

* * * * *